(12) United States Patent
Cho et al.

(10) Patent No.: US 7,304,383 B2
(45) Date of Patent: Dec. 4, 2007

(54) TFT SUBSTRATE FOR LIQUID CRYSTAL DISPLAY APPARATUS AND METHOD OF MANUFACTURING THE SAME

(75) Inventors: Beom-Seok Cho, Seoul (KR); Chang-Oh Jeong, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/535,304

(22) PCT Filed: Oct. 27, 2003

(86) PCT No.: PCT/KR03/02270

§ 371 (c)(1),
(2), (4) Date: Jan. 17, 2006

(87) PCT Pub. No.: WO2004/047159

PCT Pub. Date: Jun. 3, 2004

(65) Prior Publication Data

US 2006/0151788 A1    Jul. 13, 2006

(30) Foreign Application Priority Data

Nov. 19, 2002  (KR) ............... 10-2002-0072001

(51) Int. Cl.
*H01L 23/48* (2006.01)
*H01L 23/52* (2006.01)
*H01L 29/40* (2006.01)

(52) U.S. Cl. ............ 257/751; 257/59; 257/72; 257/753; 257/762; 257/E27.131; 349/46; 349/139; 349/147; 349/148

(58) Field of Classification Search ............ None
See application file for complete search history.

(56) References Cited

U.S. PATENT DOCUMENTS

| | | | |
|---|---|---|---|
| 5,932,907 A | 8/1999 | Grill et al. | |
| 6,211,084 B1 | 4/2001 | Ngo et al. | |
| 6,329,701 B1 | 12/2001 | Ngo et al. | |
| 6,686,661 B1* | 2/2004 | Lee et al. ............ | 257/741 |

(Continued)

FOREIGN PATENT DOCUMENTS

EP            0 260 906         9/1987

(Continued)

*Primary Examiner*—Sue A. Purvis
*Assistant Examiner*—Leslie Pilar Cruz
(74) *Attorney, Agent, or Firm*—Cantor Colburn LLP

(57) ABSTRACT

There are provided a TFT substrate for an LCD apparatus and a method of manufacturing the same. A substrate (10), a diffusion barrier layer (11) and a copper alloy layer (12) are formed on the TFT substrate, consecutively. The copper alloy includes a material from about 0.5 at % to about 15 at % to form a gate wiring layer. The material is used to form the diffusion barrier layer (11). A compound that comprises a material such as Zr, Ti, Hf, V, Ta, Ni, Cr, Nb, Co, Mn, Mo, W, Rh, Pd, Pt, etc. is deposited on the diffusion barrier layer (11) to a thickness from about 50 Å to about 5,000 Å. The deposited compound is then heat treated to convert the deposited compound into a silicide compound (11b). The transistor substrate has low resistance and high conductance. Also, etching process is simplified, and a mutual diffusion is prevented by means of the thin diffusion barrier layer.

5 Claims, 36 Drawing Sheets

U.S. PATENT DOCUMENTS

| | | |
|---|---|---|
| 6,888,198 B1 * | 5/2005 | Krivokapic ................. 257/347 |
| 2002/0076574 A1 * | 6/2002 | Cabral et al. ............... 428/660 |
| 2002/0096681 A1 | 7/2002 | Yamazaki et al. |
| 2002/0123220 A1 | 9/2002 | Sambucetti et al. |
| 2002/0182858 A1 * | 12/2002 | Farrar ........................ 438/652 |
| 2003/0001266 A1 * | 1/2003 | Hu ............................. 257/758 |

FOREIGN PATENT DOCUMENTS

| | | |
|---|---|---|
| JP | 08-102502 | 4/1996 |
| JP | 2000-277456 | 10/2000 |

* cited by examiner

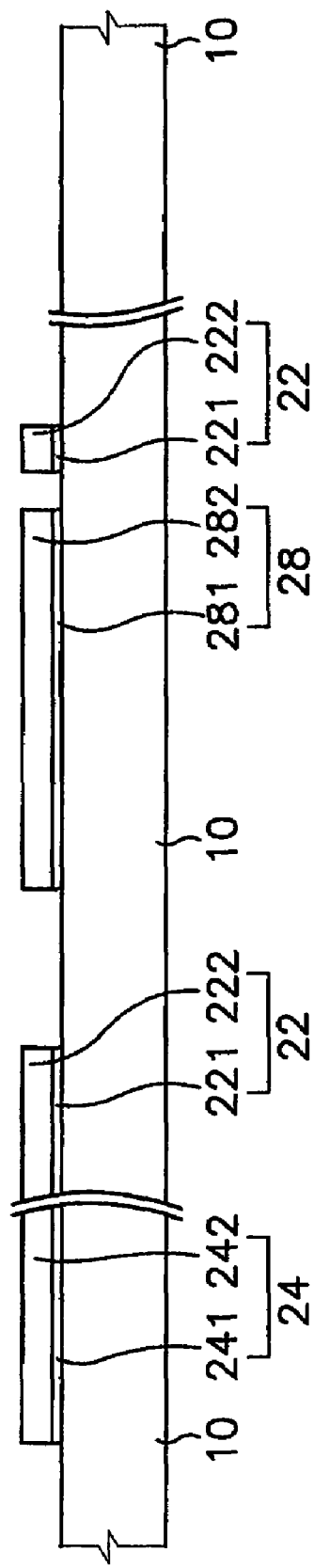

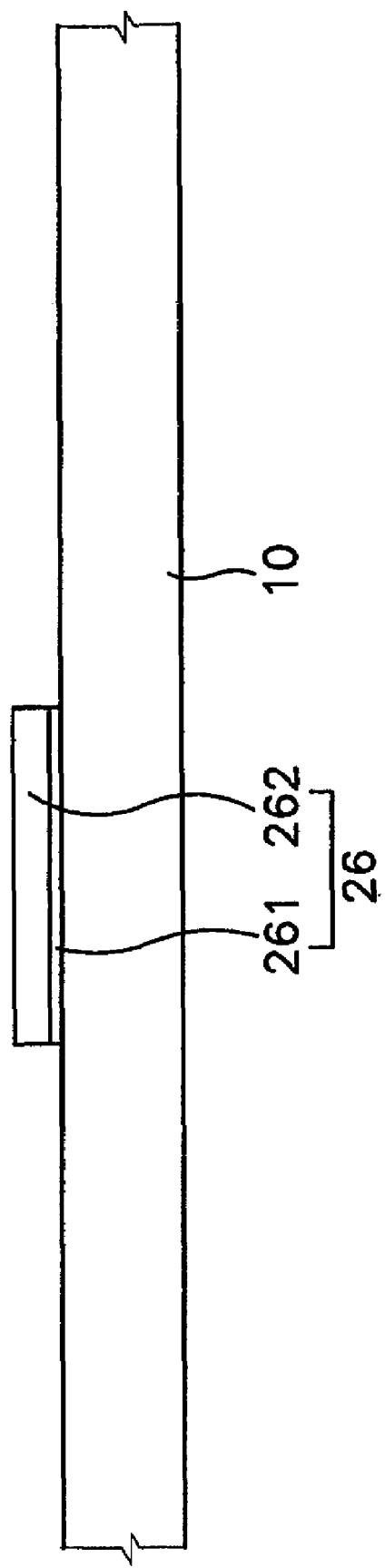

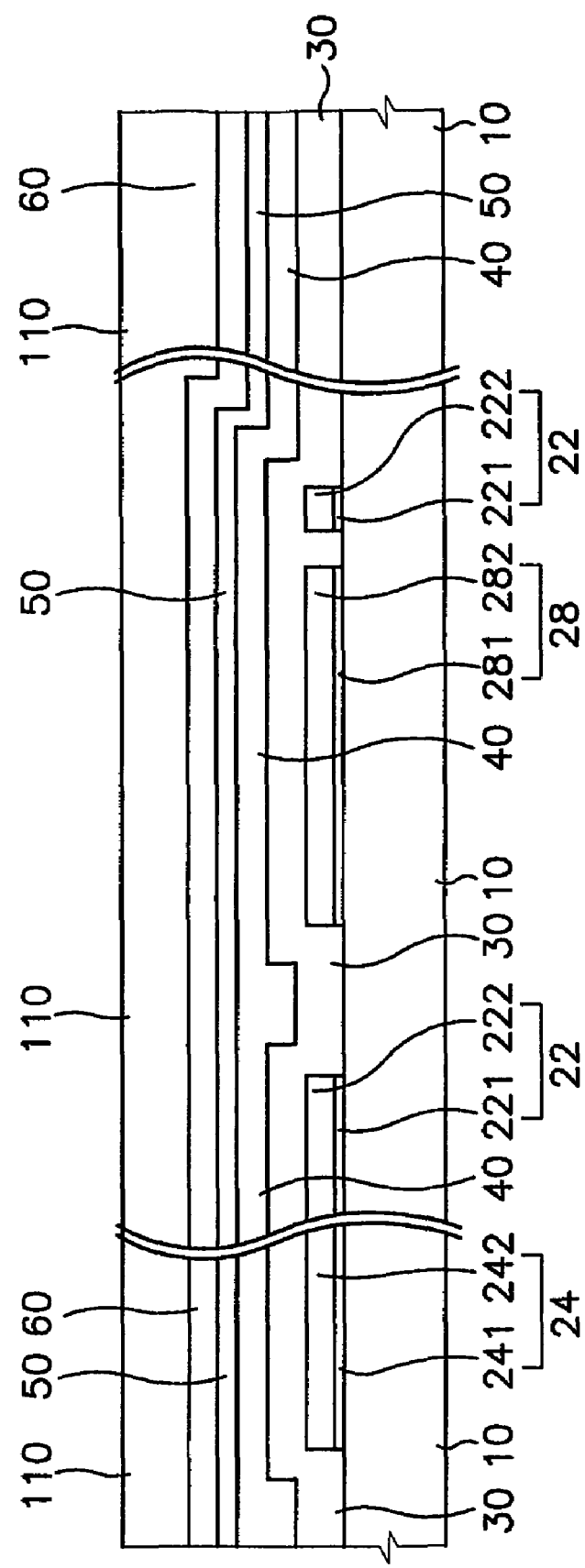

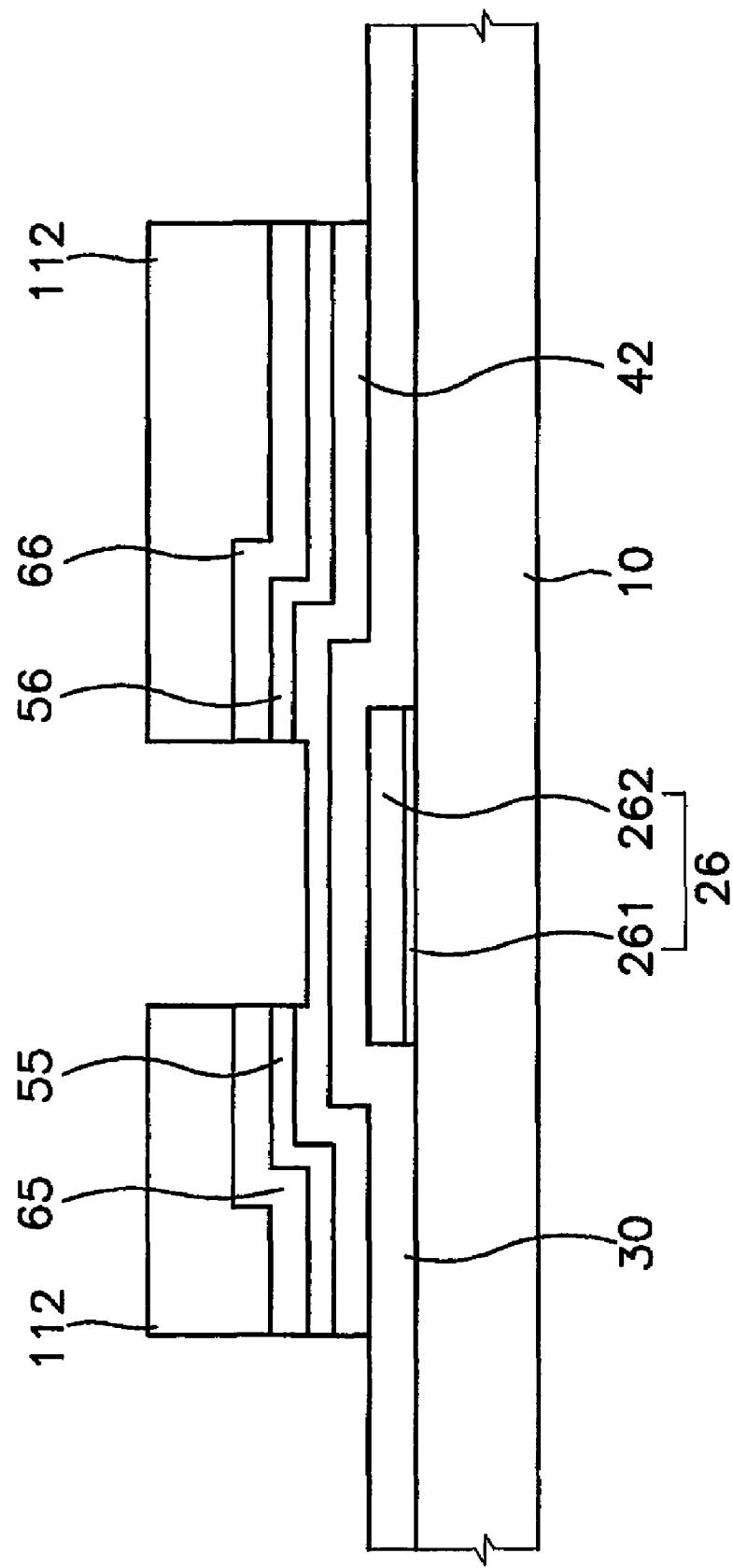

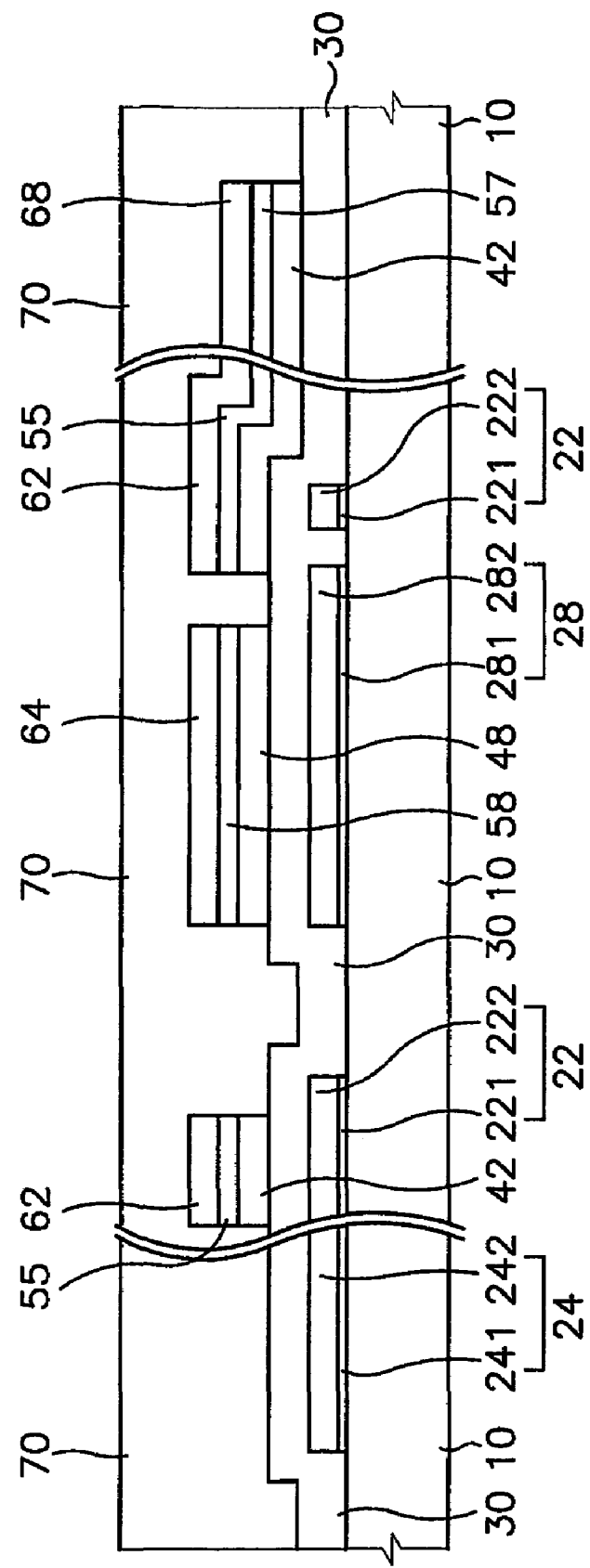

TFT SUBSTRATE FOR LIQUID CRYSTAL DISPLAY APPARATUS AND METHOD OF MANUFACTURING THE SAME

TECHNICAL FIELD

The present invention relates to a thin film transistor (hereinafter, referred to as TFT) substrate of liquid crystal display apparatus and a method of manufacturing the same, and more particularly, a TFT substrate for a liquid crystal display apparatus having a copper wiring of low resistivity and a method of manufacturing the same.

BACKGROUND ART

A display apparatus is an electric optical apparatus converting an electric signal into an optical image so that a user recognizes information. A liquid crystal display (hereinafter, referred to as LCD) apparatus of the display apparatus supplies electrical field to transform an arrangement of liquid crystal molecules by means of an optical characteristics of the liquid crystal.

A TFT of a large display substrate needs a low gate resistance to prevent signal delay and flickering of an image. Metals such as copper or aluminum have low resistance and high conductivity. However, the metals are improper for manufacturing an LCD apparatus. The copper has the lowest resistivity among the metals, but the copper has low adhesiveness to a silicon-containing substrate. The copper is also oxidized easily. The copper may be prevented from diffusing into the silicon containing substrate, and sufficient adhesiveness may be necessary so as to use the copper wiring in the TFT process.

The diffusion of the copper into the silicon-containing substrate deteriorates ohmic contact characteristics of elements, and the low adhesiveness causes lift-off of a thin film and abrasion of the thin film. The lift-off and the abrasion cause problems in manufacturing process.

DISCLOSURE OF THE INVENTION

Accordingly, the present invention has been devised to solve the foregoing problems of the conventional art, and the present invention provides a TFT substrate for an LCD apparatus having a copper wiring of low resistivity and preventing a diffusion of the copper into a silicon-containing substrate, thereby improving element characteristics.

The present invention also provides a method of manufacturing a TFT substrate for an LCD apparatus having the copper wiring.

The TFT substrate for an LCD apparatus in accordance with one exemplary embodiment of the present invention includes a substrate, a diffusion barrier layer and a copper alloy layer. The substrate comprises silicon. The diffusion barrier layer is formed on the substrate, and the copper alloy layer is formed on the diffusion barrier layer. Hereinafter, atomic percent is represented by "at %". The copper alloy layer has a material from about 0.5 at % to about 15 at %, which is used to form the diffusion barrier layer.

Preferably, the diffusion barrier layer includes a silicide compound that comprises a metal such as Zr, Ti, Hf, V, Ta, Ni, Cr, Nb, Co, Mn, Mo, W, Rh, Pd, Pt, etc., and a thickness of the diffusion barrier layer is from about 50 Å to about 5,000 Å.

Also, the copper alloy layer may include a metal layer corresponding to a gate line, a source electrode, a drain electrode or a data line, and the substrate may be a silicon substrate, a glass substrate or a plastic substrate.

The method of manufacturing a TFT substrate for a display apparatus in accordance with one aspect of the present invention is provided as follows. A diffusion barrier layer is formed on a silicon-containing substrate. An alloy including copper and a material from about 0.5 at % to about 15 at %, which is used to form the diffusion barrier layer, is deposited to form a gate wiring layer. The gate wiring layer is then etched to form a gate wiring pattern. The gate wiring pattern has a gate line, a gate pad and a gate electrode. A gate insulating layer is then stacked. A semiconductor layer pattern and an ohmic contact layer pattern are then formed. A data wiring material is then coated and patterned to form a data wiring. The data wiring has a data line, a data pad, a source electrode and a drain electrode. The data line intersects the gate line. The data pad is connected to an end portion of the data line. The source electrode is connected to an end portion of the data line, and the source electrode is adjacent to the gate electrode. The drain electrode is opposite to the source electrode by interposing the gate electrode therebetween. A protecting layer including a passivation layer is then formed. The protecting layer may include an organic layer. The protecting layer and the gate insulating layer are then patterned to form contact holes. The gate pad, the data pad and the drain electrode are exposed through the contact holes, respectively. A transparent conductive layer is then stacked. The transparent conductive layer is then etched to form an auxiliary gate pad, an auxiliary data pad and a pixel electrode. The auxiliary gate pad is connected to the gate pad, the auxiliary data pad is connected to the data pad, and the pixel electrode is connected to the drain electrode.

Particularly, a compound that comprises a metal such as Zr, Ti, Hf, V, Ta, Ni, Cr, Nb, Co, Mn, Mo, W, Rh, Pd, Pt, etc. is deposited to form the diffusion barrier layer having a thickness from about 50 Å to about 5,000 Å. The deposited compound is converted into a silicide compound by means of heat-treatment process.

The heat-treatment process may be a deposition treatment process that stacks a subsequent gate insulating layer, and the heat-treatment process may be performed at a temperature from about 200° C. to about 500° C. under a vacuum, an air or an $N_2$ atmosphere.

The method of manufacturing a TFT substrate for a display apparatus in accordance with another aspect of the present invention is provided as follows. A diffusion barrier layer is formed on a substrate. An alloy including copper and a material from about 0.5 at % to about 15 at %, which is used to form the diffusion barrier layer, is deposited to form a gate wiring layer. The gate wiring layer is then etched to form a gate pattern. The gate pattern includes a gate line, a gate pad and a gate electrode. A gate insulating layer is then stacked. A semiconductor layer, an ohmic contact layer and a conductive layer are then stacked. A photoresist pattern is then formed. The photoresist pattern has a first portion, a second portion and a third portion. The second portion is thicker than the first portion. The third portion is thinner than the first portion. A data line, a data pad, a data wiring, an ohmic contact layer and a semiconductor layer pattern are then formed by means of the photoresist pattern. The data pad is connected to an end portion of the data line. The data wiring has a source electrode and a drain electrode. A protecting layer including a passivation layer is then formed. The protecting layer may include an organic layer. The protecting layer and the gate insulating layer are patterned to form contact holes through which the gate pad, the data pad and the drain electrode are exposed. A transparent conductive layer is then stacked. The transparent conductive layer is then etched to form an auxiliary gate pad, an auxiliary data pad and a pixel electrode. The auxiliary gate pad is connected to the gate pad. The auxiliary data pad is connected to the data pad. The pixel electrode is connected to the drain electrode.

The method of manufacturing a TFT substrate for a display apparatus in accordance with still anther aspect of the present invention is provided as follows. A diffusion barrier layer is formed on an insulating substrate. An alloy including copper and a material from about 0.5 at % to about 15 at %, which is used to form the diffusion barrier layer, forms a data wiring. A red color filter, a green color filter and a blue color filter are then formed on the substrate. A buffer material is then deposited to form a buffer layer covering the data wiring and the color filters. A gate wiring layer is then formed on the buffer layer. The gate wiring layer is then etched to form a gate wiring. The gate wiring includes a gate line and a gate electrode. A gate insulating layer covering the gate wiring is then formed. An ohmic contact layer pattern of an island shape, a semiconductor layer pattern and a first contact hole are then formed on the gate insulating layer. A portion of the data line is exposed through the first contact hole to the gate insulating layer and the buffer layer. The transparent conductive material is then etched to form a source electrode, a drain electrode and a pixel wiring. The drain electrode is separated from the source electrode. The source electrode and the drain electrode are then formed on the same layer. The pixel wiring having a pixel electrode is connected to the drain electrode. The ohmic contact pattern that has an island shape is coated by means of the transparent conductive material. An exposed portion of the ohmic contact layer pattern is then removed so that the ohmic contact layer pattern is divided into two parts. The ohmic contact layer pattern is disposed between the source electrode and the drain electrode.

BRIEF DESCRIPTION OF THE DRAWINGS

The above objects and other advantages of the present invention will become more apparent by describing in detail the preferred embodiments thereof with reference to the accompanying drawings, in which:

FIGS. 11A and 11B to 18A and 18B are cross-sectional views showing a process of manufacturing the TFT substrate of FIG. 9 and FIG. 10, respectively;

BEST MODE FOR CARRYING OUT THE INVENTION

Figure 1A:
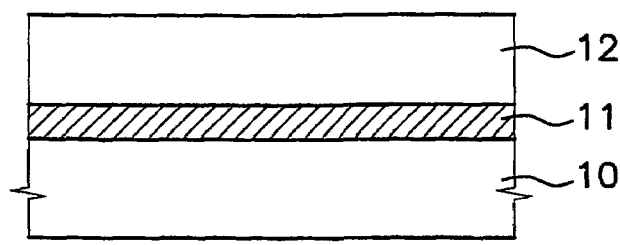
FIGS. 1A to 1C are cross-sectional views showing a process of manufacturing a copper alloy wiring on a TFT for an LCD apparatus according to an exemplary embodiment of a method of the present invention.

Hereinafter, the present invention will be disclosed in detail.

In order to use a copper wiring in manufacturing a TFT substrate for an LCD apparatus, an adhesiveness between a copper wiring and a silicon-containing substrate is necessary. Also, a reaction of the copper with the silicon-containing substrate by means of subsequent heat treatments of high temperature is prevented. The heat treatments may be performed during deposition of SiNx and process of indium tin oxide (ITO) annealing.

According to the present invention, a diffusion barrier layer is formed on a silicon-containing substrate. The diffusion barrier layer is formed by means of a metal such as Zr, Ti, Hf, V, Ta, Ni, Cr, Nb, Co, Mn, Mo, W, Rh, Pd, Pt, etc. A silicide is easily formed by the reaction between the metal and the silicon-containing substrate. An alloy including a portion of the metal is used instead of a pure copper. The alloy prevents copper from diffusing on an interface into the silicon-containing substrate. The alloy has a material from about 0.5 at % to about 15 at %, which is used to form the diffusion barrier layer. When a content of the material added to the copper is less than about 0.5 at %, the copper of the alloy may be diffused into the substrate. When the content of the material added to the copper increases, a resistivity of the copper wiring also increases, thereby increasing a resistance of the wiring. Preferably, the content of the material added to the copper does not exceed about 15 at %.

As a thickness of the diffusion barrier layer increases, characteristics of the diffusion barrier layer are improved. However, a thin diffusion barrier layer is preferable so as to etch the diffusion barrier layer with the copper alloy wiring. Preferably, the thickness of the diffusion barrier layer is from about 50 Å to about 1,000 Å.

High temperature process such as SiNx deposition is performed after a formation of the copper metal wiring. The diffusion barrier layer prevents the copper elements from diffusing into the substrate. The diffusion barrier layer is transformed into a silicide by the high temperature process. When the material added in the copper diffuse on an interface or a surface, the material is supplied to the diffusion barrier layer to improve the characteristics of the diffusion barrier layer, thereby forming an additional silicide. Also, the alloy elements diffused on the surface may improve a chemical resistance of the copper metal layer during subsequent processes.

In order to form a silicide, additional heat-treatment process may be performed after depositing the diffusion barrier layer. Preferably, the additional heat-treatment process is performed at a temperature from about 200° C. to about 500° C. under a vacuum, an atmospheric pressure or an $N_2$ atmosphere. Although the heat-treatment process may be omitted to simplify processes and to reduce cost and time. Subsequent heat-treatment process may provide the same heat-treatment effect. However, more stable heat-treatment process may be performed by means of the additional heat-treatment process, subsequent process can be performed in more stable condition after the heat-treatment process of the alloy.

Therefore, a TFT substrate for an LCD apparatus is manufactured by means of a copper alloy wiring to have low resistance and high conductance.

Also, a copper wiring is formed by means of a thin diffusion barrier layer and the copper alloy including the material of the diffusion barrier layer so that simultaneous etching may be accomplished. A mutual diffusion between the copper wiring and the substrate in subsequent processes is also prevented by means of the thin diffusion barrier layer.

Figure 1B:
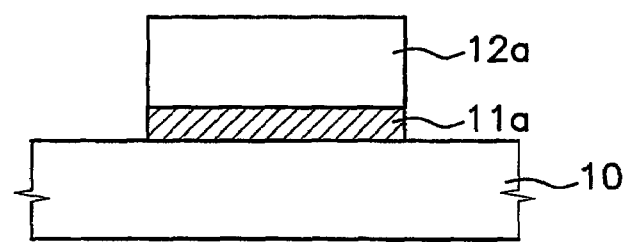
Figure 1C:
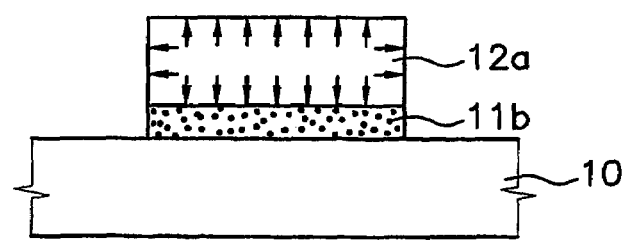

FIGS. 1A to 1C are cross-sectional views showing a process of manufacturing a copper alloy wiring on a TFT for an LCD apparatus according to an exemplary embodiment of a method of the present invention.

Referring to FIG. 1A, a diffusion barrier layer 11 is formed on a silicon-containing substrate 10, and a copper alloy wiring 12 is formed on the diffusion barrier layer 11. Referring to FIG. 1B, the wiring is etched using a mask to form a diffusion barrier layer pattern 11A and a wiring pattern 12A on the substrate 10. Referring to FIG. 1C, elements of the diffusion barrier layer in the wiring pattern 12A diffuse into a surface by additional heat-treatment process or subsequent heat-treatment process, and the diffusion barrier layer pattern 11A is converted into a silicide compound layer 11B.

Hereinafter, a TFT substrate for an LCD apparatus according to an exemplary embodiment of the present invention will be described with reference to accompanying drawings.

Figure 2:
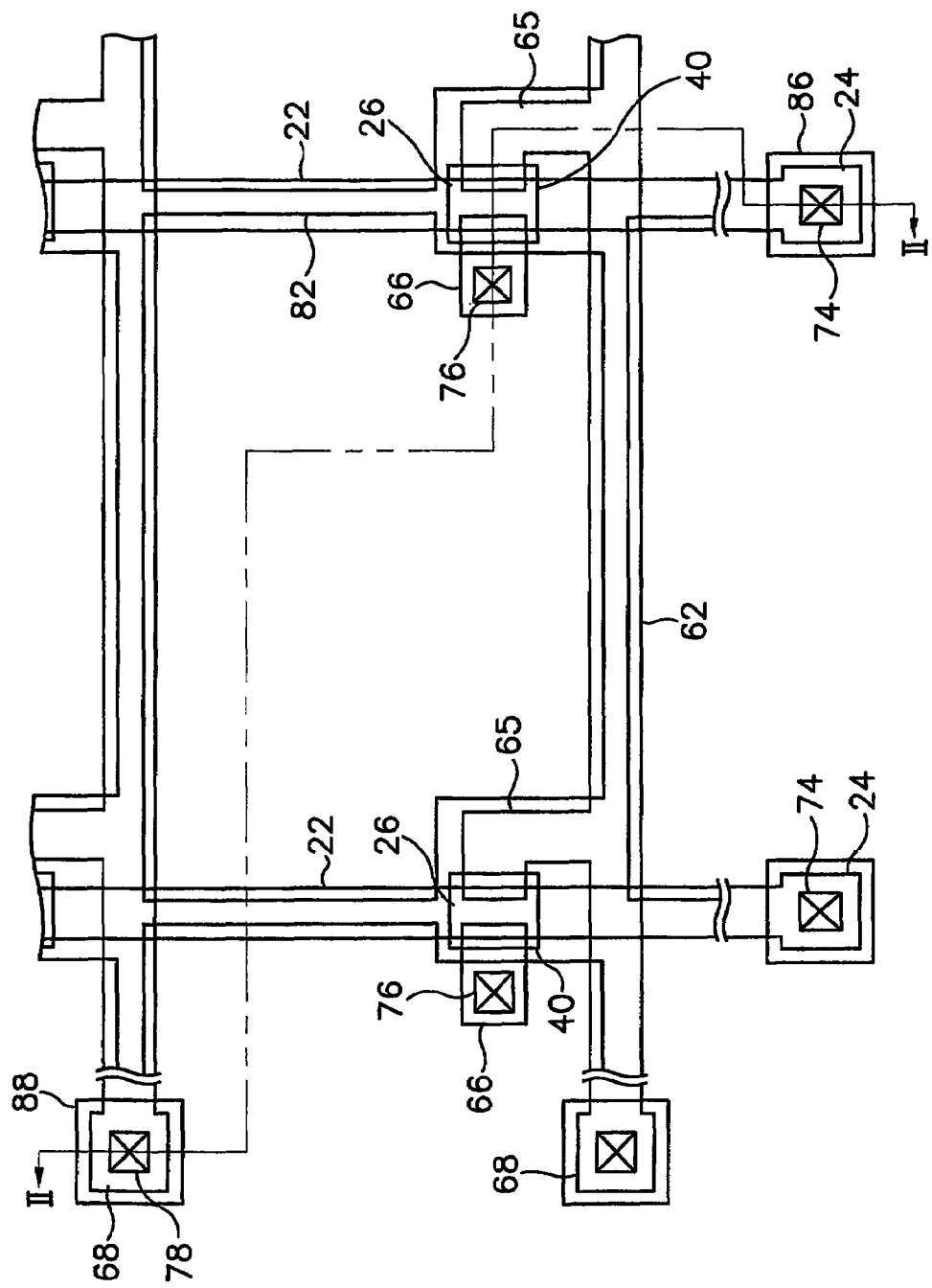
FIG. 2 is a plan view showing a TFT substrate for an LCD apparatus according an exemplary embodiment of the present invention.
Figure 3:
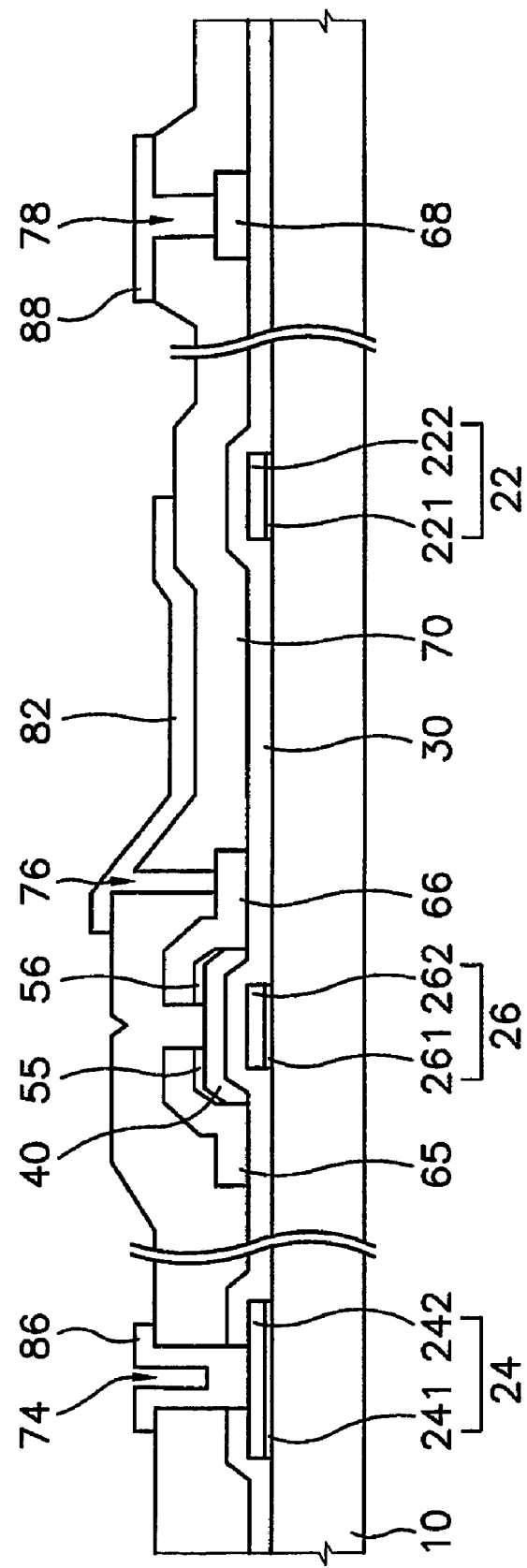
FIG. 3 is a cross-sectional view taken along a line II-II' shown in FIG. 2.

FIG. 2 is a plan view showing a TFT substrate for an LCD apparatus according to an exemplary embodiment of the present invention, and FIG. 3 is a cross-sectional view taken along a line II-II' shown in FIG. 2.

Gate wirings are formed on an insulating substrate 10. The gate wirings are double layered, and include diffusion barrier layers 221, 241 and 261 and gate wiring layers 222, 242 and 262. The diffusion barrier layers 221, 241 and 261 include a metal silicide, and the gate wiring layers 222, 242 and 262 include a copper alloy that has the material of the diffusion barrier layer. The gate wirings include a gate line 22, a gate pad 24 and a gate electrode 26 of a TFT. The gate pad 24 is connected to an end portion of the gate line 22 extended to transmit a gate signal from outside to the gate line 22 in a horizontal direction with respect to the TFT substrate, and the gate electrode 26 is also connected to the gate line 22.

A gate insulating layer 30 formed on the substrate 10 is formed over the gate wirings 22, 24 and 26. The gate insulating layer 30 includes silicon nitride.

A semiconductor layer 40 is formed on the gate insulating layer 30 of the gate electrode 24. The semiconductor layer 40 has semiconductor material such as amorphous silicon. Ohmic contact layers 54 and 56 are formed on the semiconductor layer 40. The ohmic contact layers 54 and 56 have a silicide or N+hydrogenated amorphous silicon doped with N type dopants by a high concentration.

Data wiring layers 62, 65, 66 and 68 are formed on the ohmic contact layers 54 and 56 and the gate insulating layer 30. The data wiring layers 62, 65, 66 and 68 have a molybdenum layer or a molybdenum-tungsten alloy layer. The data wiring layers 62, 65, 66 and 68 extend in a longitudinal direction with respect to the substrate 10. The data wiring layers 62, 65, 66 and 68 include a data line 62, a source electrode 65, a data pad 68 and a drain electrode 66. The data line 62 intersects the gate line 22, and the data line 62 defines a pixel. The source electrode 65 is divided from the data line 62, and the source electrode 65 extends to an upper portion of the ohmic contact layer 54. The data pad 68 is connected to an end portion of the data line 62, and the data pad 68 receives a pixel signal from outside. The drain electrode 66 is separated from the source electrode 65 and the drain electrode 66 is disposed on the ohmic contact layer 56. The drain electrode is opposite to the source electrode 65 by interposing the gate electrode 26 therebetween. A protecting layer including a passivation layer 70 is formed on the data wirings 62, 65, 66 and 68. The protecting layer may include an organic layer.

Contact holes 76 and 78 are formed through which the drain electrode 66 and the data pad 68 are exposed, respectively. Another contact hole 74 is formed through which the gate pad 24 and the gate insulating layer 30 are exposed. The contact holes 76 and 78 are formed in a polygonal shape or a circular shape, through which the drain electrode 66 and the data pad 68 are exposed. Dimension of each of the contact holes is no more than about 2 mm×60 μm. Preferably, the dimension is no less than about 0.5 mm×15 μm.

A pixel electrode 82 is formed on the passivation layer 70 in a pixel. The pixel electrode 82 is electrically connected to the drain electrode 66 through the contact hole 76. Also, an auxiliary gate pad 86 and an auxiliary data pad 88 are formed on the passivation layer 70. An auxiliary gate pad 86 and an auxiliary data pad 88 are connected to the gate pad 24 and the data pad 68 through the contact holes 74 and 78, respectively. The pixel electrode 82, the auxiliary gate pad 86 and the auxiliary data pad 88 have ITO.

Referring to FIG. 2 and FIG. 3, a storage capacitor includes the pixel electrode 82 and the gate line 22. When storage capacitance of the storage capacitor is insufficient, an additional wiring for the storage capacitor may be formed on a layer identical to the gate wirings 22, 24 and 26.

Also, the pixel electrode 82 is overlapped with the data line 62 to maximize an aperture ratio. Although the pixel electrode 82 is overlapped on the data line 62, parasite storage capacitance is low because of a low dielectric constant of the passivation layer.

Hereinafter, referring to FIGS. 2 to 8, a method of manufacturing the TFT substrate for the LCD apparatus according to an exemplary embodiment of the present invention will be disclosed.

Figure 4:
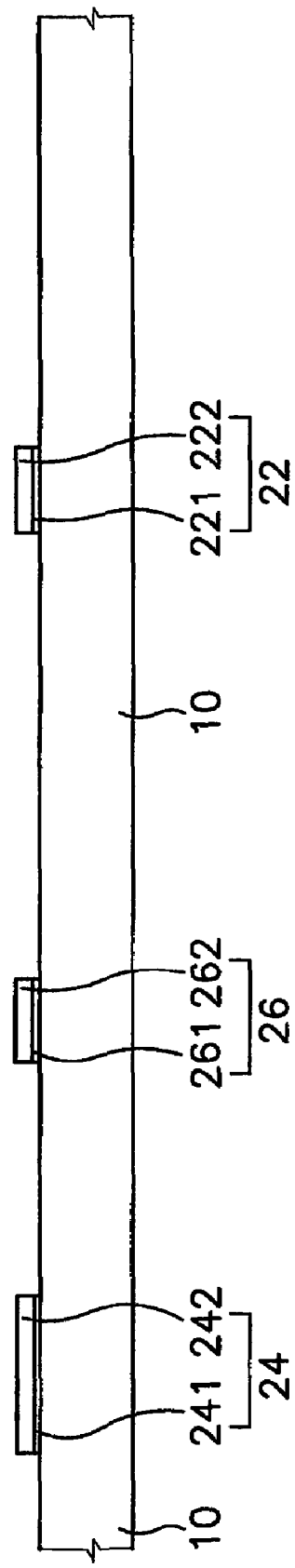
FIGS. 4 to 7 are cross-sectional views showing a process of manufacturing the TFT substrate for an LCD apparatus according to an exemplary embodiment of the present invention.

Referring to FIG. 4, a metal such as Zr, Ti, Hf, V, Ta, Ni, Cr, Nb, Co, Mn, Mo, W, Rd, Pd, Pt, etc. is deposited on a substrate 10 to a thickness from about 50 Å to about 1,000 Å to stack diffusion barrier layers 221, 241 and 261. A copper alloy including the material from about 0.5 at % to about 15 at % is then deposited to stack gate wiring layers 222, 242 and 262. The material is used to form the diffusion barrier layer. The stacked gate wiring layers 222, 242 and 262 are then patterned to form gate wirings. The gate wirings are extended laterally, and the gate wirings have the gate line 22, the gate electrode 26 and the gate pad 24.

Figure 5:
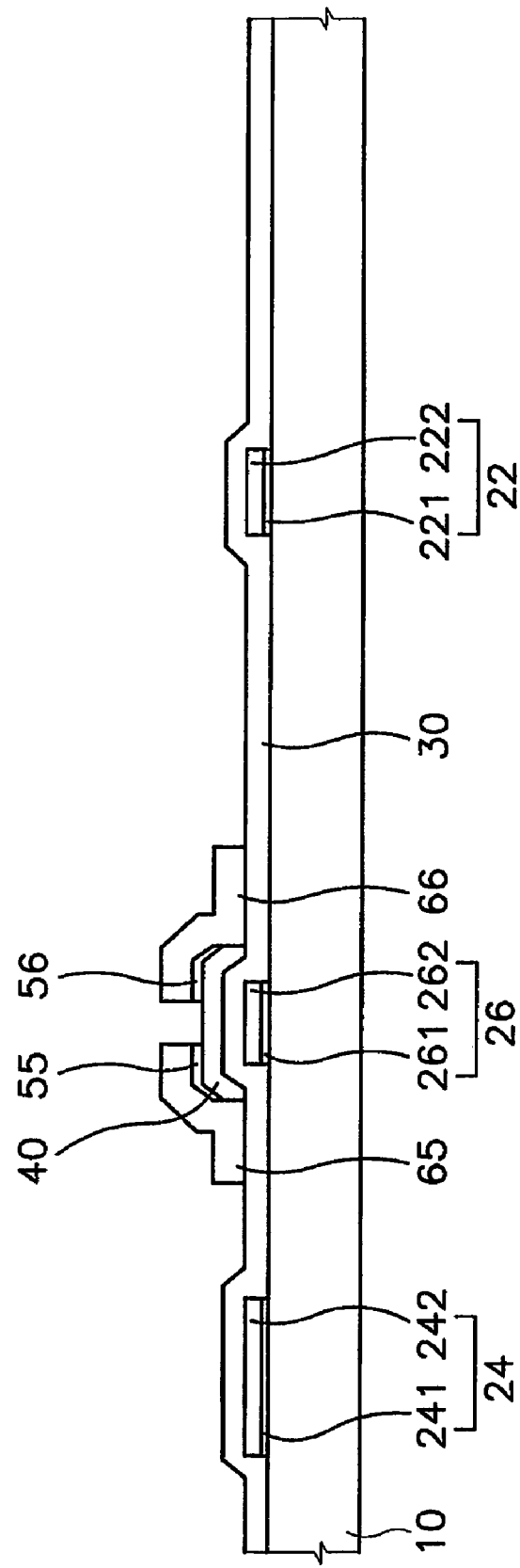

Referring to FIG. 5, a gate insulating layer 30 including silicon nitride is then formed. A semiconductor layer 40 including an amorphous silicon layer is stacked on the gate insulating layer 30. A doped amorphous silicon layer is stacked on the semiconductor layer 40. The semiconductor layer 40 and the doped amorphous silicon layer are then etched. Therefore, a semiconductor layer 40 of an island shape and ohmic contact layers 55 and 56 are formed on the gate insulating layer 30 by means of a photolithography process. The gate insulating layer 30 is disposed on the gate electrode 26.

Figure 6:
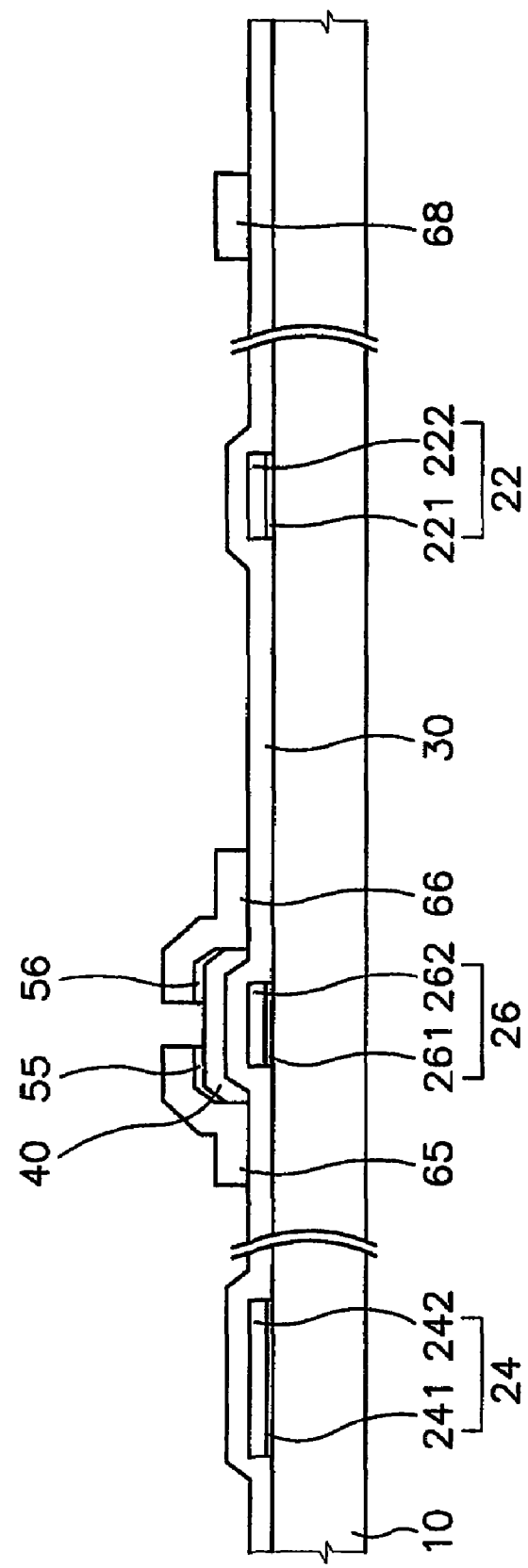

Referring to FIG. 6, molybdenum or molybdenum-tungsten alloy is then deposited to stack data wiring layers 65, 66 and 68. The data wiring layers 65, 66 and 68 are then etched to form a data wiring including a data line 62, a source electrode 65, a data pad 68 and a drain electrode 66. The data line 62 intersects the gate line 22. The source electrode 65 is connected to the data line 62, and the source electrode 65 extends to an upper portion of the gate electrode 26. The data pad 68 is connected to one end portion of the data line 62. The drain electrode 66 is separated from the source electrode 65, and the drain electrode 66 is opposite to the source electrode 65 by interposing the gate electrode 26 therebetween.

Figure 7:
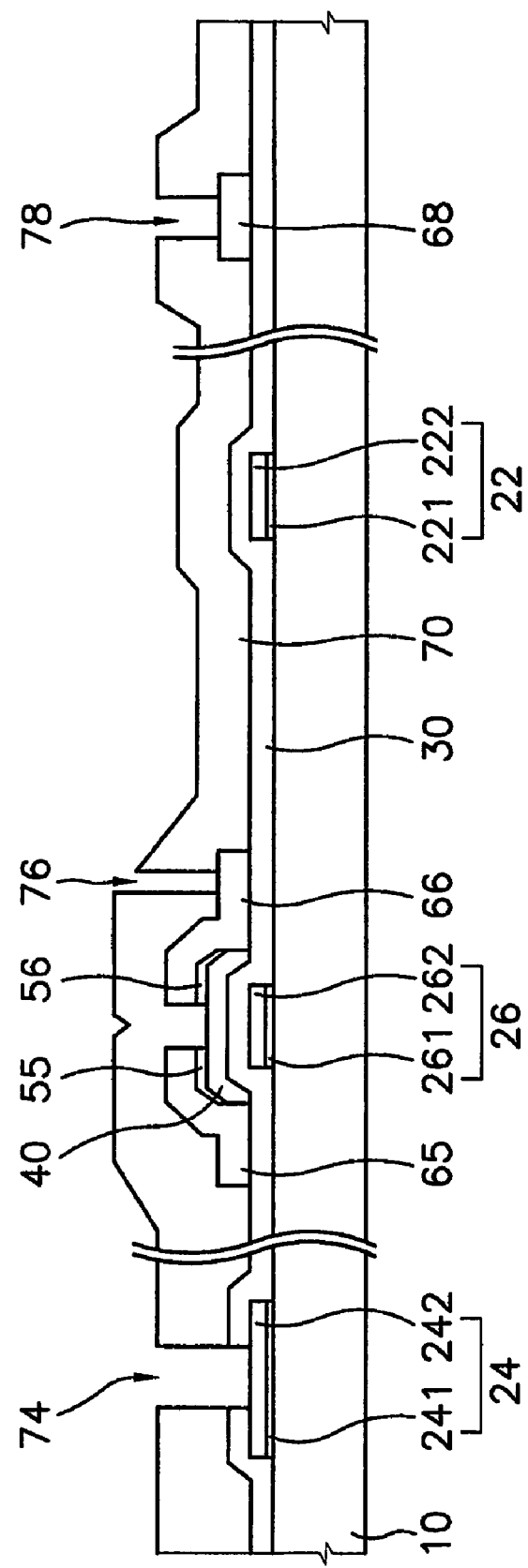

A portion of an amorphous silicon pattern that is not masked by the data wirings 62, 65, 66 and 68 is then etched so that the amorphous silicon pattern is divided into two regions so that the semiconductor layer pattern 40 is exposed. The amorphous silicon pattern is doped with impurities. The semiconductor layer pattern 40 is disposed between the divided amorphous silicon layers 55 and 56. Preferably, a surface of the exposed semiconductor layer 40 is then stabilized by oxygen plasma. Referring to FIG. 7, a passivation layer is then formed.

The gate insulating layer 30 and the passivation layer are then patterned to form contact holes 74, 76 and 78. The gate pad 24, the drain electrode 66 and the data pad 68 are exposed through the contact holes 74, 76 and 78, respectively. The contact holes 74, 76 and 78 may have a circular shape or a polygonal shape. Dimensions of the contact holes 74 and 78 are not more than or equal to about 2 mm×60 μm. The pads 24 and 68 are exposed through the contact holes 74 and 78. Preferably, dimensions of the contact holes 74 and 78 are no less than 0.5 mm×15 μm.

Referring to FIGS. 2 to 3, ITO layer is then deposited. The deposited ITO layer is then etched. Therefore, an auxiliary gate pad 86, an auxiliary data pad 88 and a pixel electrode 82 are formed by means of a photolithography process. The pixel electrode 82, the auxiliary gate pad 86 and the auxiliary data pad 88 are connected to the drain electrode 66, the gate pad 24 and the data pad 68 through a first contact hole 76, a second contact hole 74 and a third contact hole 78. Preferably, nitrogen gas is used in a pre-heating process. The pre-heating may be performed before depositing the ITO. The nitrogen gas prevents formation of a metal oxide layer that may be formed on an upper portion of metal layers 24, 66 and 68 that are exposed through the contact holes 74, 76 and 78.

Hereinafter, referring to FIGS. 8 to 10, a unit pixel of the TFT substrate for the LCD apparatus according to an exemplary embodiment of the present invention using 4 masks will be disclosed.

Figure 8:
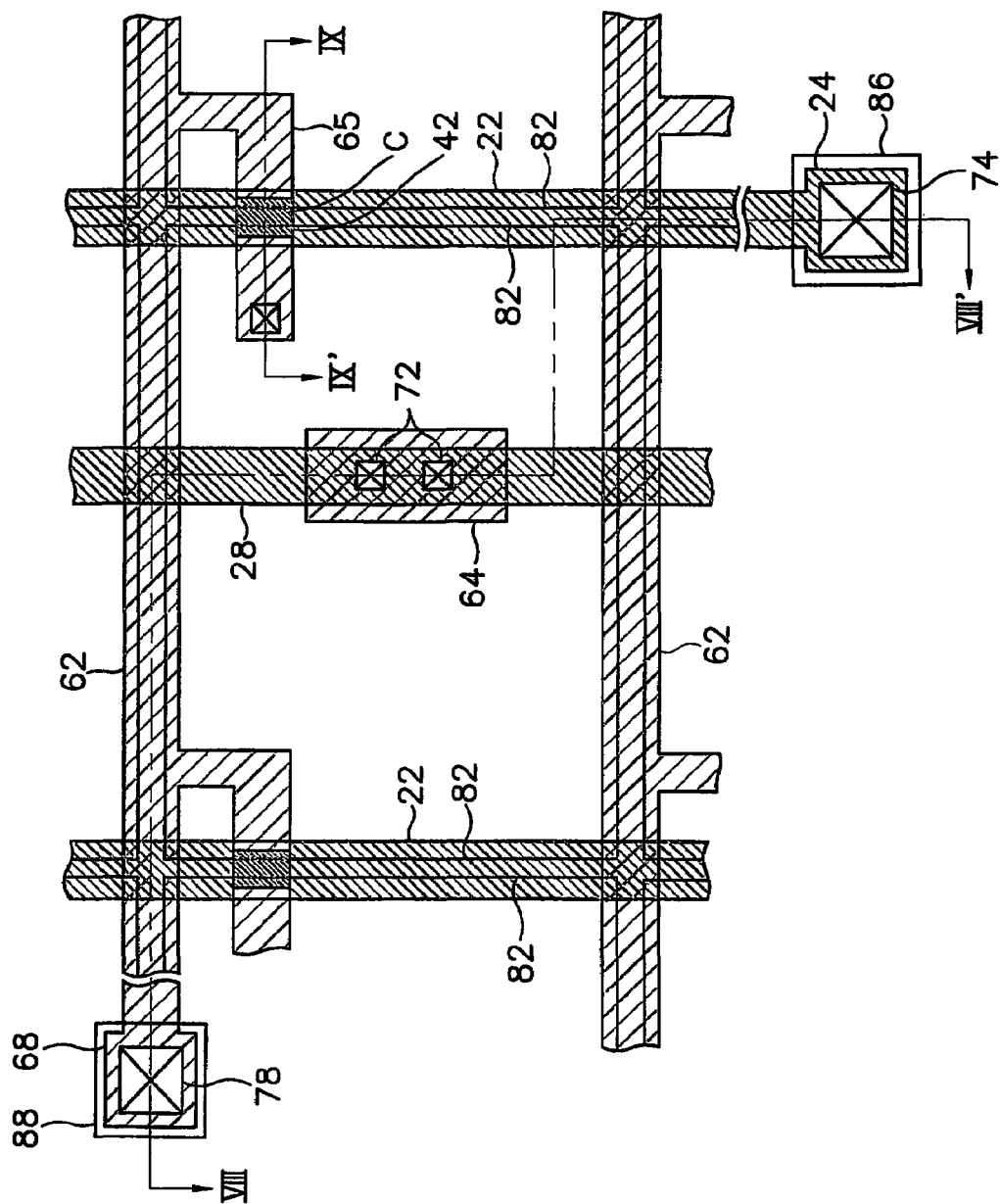
FIG. 8 is a plan view showing a TFT substrate for an LCD apparatus according to another exemplary embodiment of the present invention.
Figure 9:
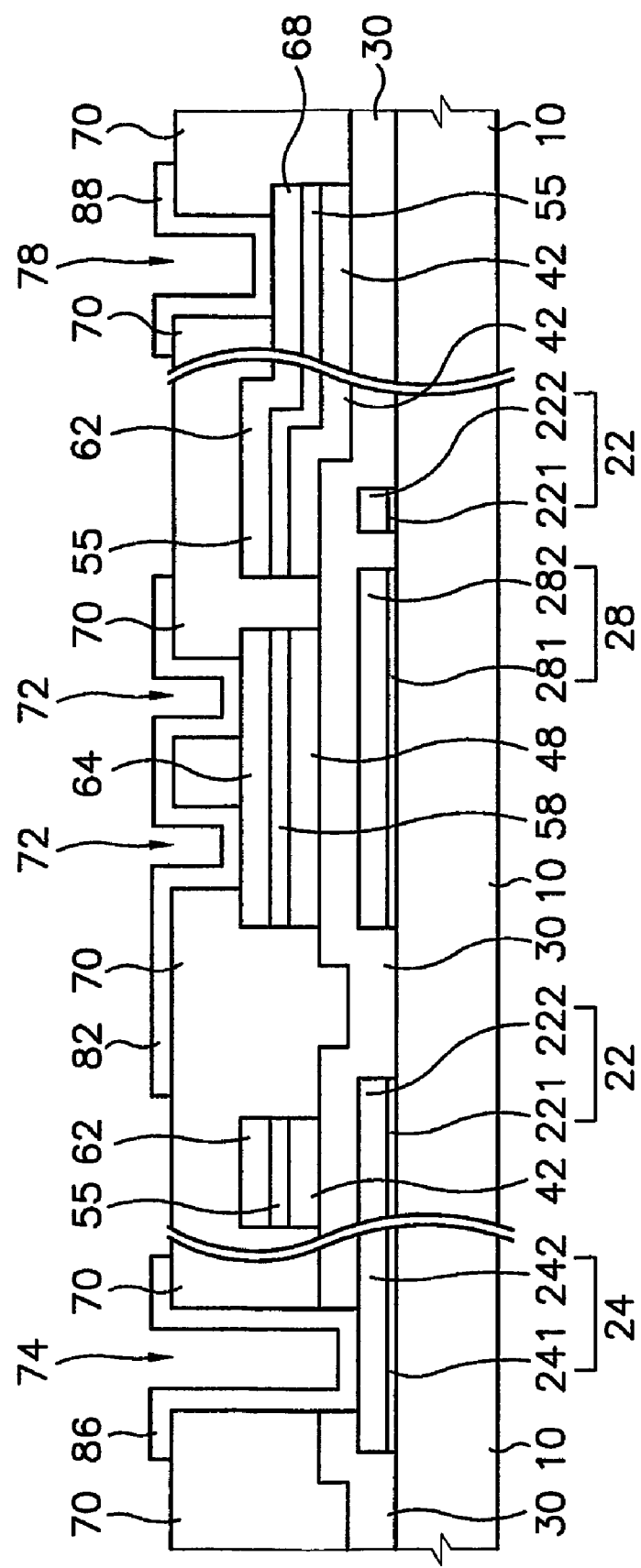
FIGS. 9 and 10 are cross-sectional views taken along lines VIII-VIII' and IX-IX' shown in FIG. 8, respectively.
Figure 10:
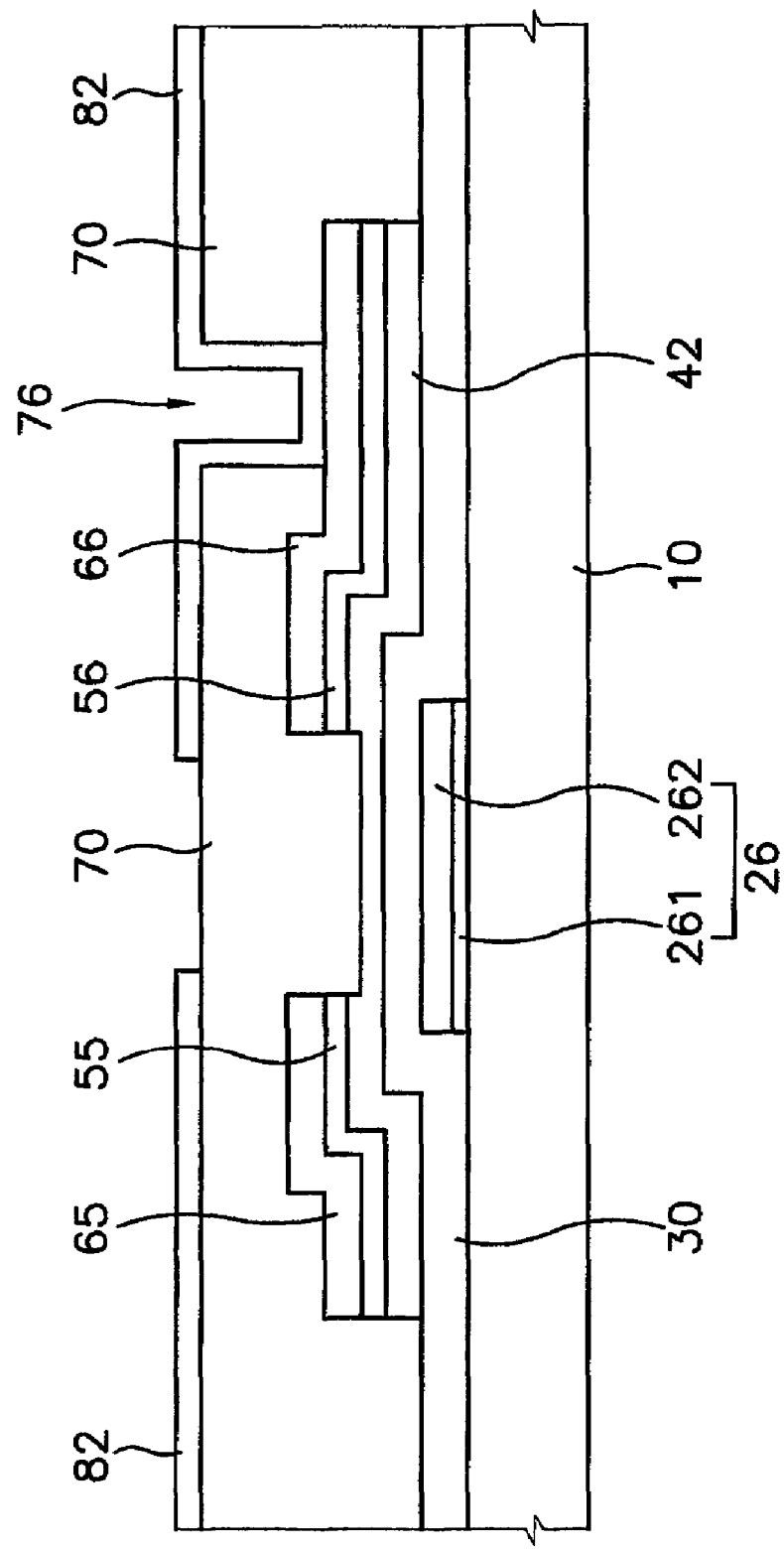

FIG. 8 is a plan view showing a TFT substrate for an LCD apparatus according to another exemplary embodiment of the present invention, and FIGS. 9 and 10 are cross-sectional views taken along lines VIII-VIII' line and IX-IX' shown in FIG. 8, respectively.

Gate wirings having a double layered structure are formed on an insulating substrate 10. The double layered structure has diffusion barrier layers 221, 241 and 261 and gate wiring layers 222, 242 and 262. The diffusion barrier layers 221, 241 and 261 have a metal silicide. The gate wiring layers 222, 242 and 262 have copper alloy. The gate wirings include a gate line 22, a gate pad 24 and a gate electrode 26.

A storage line 28 is formed on the substrate 10. The storage line is in parallel with the gate line 22. The storage line 28 includes a diffusion barrier layer 281 and a gate wiring layer 282. A storage capacitor has the storage line 28 and a conductive pattern 68. The storage capacitor stores charge to improve charge capacitance of a pixel. The storage line 28 is formed over the conductive pattern 68. The storage line may be omitted when a charge capacitance formed by pixel electrode 82 and the gate line 22 is large enough to maintain voltage difference. A voltage applied to a common electrode may be identical to a voltage applied to the storage line 28. The common electrode is formed on an upper substrate.

A gate insulating layer 30 is formed on the gate wirings 22, 24 and 26 and the storage line 28. The gate insulating layer 30 is formed over the gate wirings 22, 24, 26 and 28. The gate insulating layer 30 may have silicon nitride SiNx.

Semiconductor patterns 42 and 48 are formed on the gate insulating layer 30. The semiconductor patterns 42 and 48 have semiconductor material such as hydrogenated amorphous silicon. Ohmic contact layer patterns or intermediate layer patterns 55, 56 and 58 are formed on the semiconductor patterns 42 and 48. The ohmic contact layer patterns and the intermediate layer patterns may have amorphous silicon. The amorphous silicon is doped with N type dopants such as P (phosphorus) by a high concentration.

Data wiring layers 62, 64, 65, 66 and 68 are formed on the ohmic contact layer patterns 55, 56 and 58. The data wiring layers 62, 64, 65, 66 and 68 have molybdenum or molybdenum alloy. Data wirings include a data line assembly 62, 68 and 65 and a conductive pattern 64 for a storage capacitor. The data line assembly 62, 68 and 65 have a data line 62, a data pad 68 and a source electrode 65 of a TFT. The data line 62 extends in a longitudinal direction with respect to the substrate. The data pad 68 is connected to one end portion of the data line 62 and receives an exterior image signal. The source electrode 65 of the TFT is divided from the data line 62. The conductive pattern 64 for the storage capacitor is separated from the data line assembly 62, 68 and 65, and the conductive pattern 64 is formed on a drain electrode 66 of the TFT and the storage line 28. The drain electrode 66 is separated from the source electrode 65, and the drain electrode 66 is opposite to the source electrode 65 by interposing the gate electrode 26 therebetween. When the storage line 28 is omitted, the conductive pattern 64 for the storage capacitor is also omitted.

The ohmic contact layer patterns 55, 56 and 58 decrease a contact resistance between the semiconductor patterns 42 and 48 and the data wirings 62, 64, 65, 66 and 68. The ohmic contact layer patterns 55, 56 and 58 have shapes substantially identical to the data wirings 62, 64, 65, 66 and 68. The semiconductor patterns 42 and 48 are formed under the ohmic contact layer patterns 55, 56 and 58. The data wirings 62, 64, 65, 66 and 68 are formed on the ohmic contact layer patterns 55, 56 and 58. A middle layer pattern of the data line assembly has a shape substantially identical to the data line assembly 62, 65 and 68, and a middle layer pattern of the drain electrode has a shape substantially identical to the drain electrode 66. A middle layer pattern of the storage capacitor has a shape substantially identical to the conductive pattern of the storage capacitor.

The semiconductor pattern 42 and 48 have shapes substantially identical to the data wirings 62, 64, 65, 66 and 68 and the ohmic contact patterns 55, 56 and 68 except a channel region of the TFT. Particularly, the semiconductor pattern of the storage capacitor has a shape substantially identical to the conductive pattern of the storage capacitor, and the conductive pattern of the storage capacitor has a shape substantially identical to the contact layer pattern of the storage capacitor. However, the semiconductor pattern of the TFT is different from the data wirings or the contact layer pattern. That is, the source electrode 65 of the data line assembly and the drain electrode 66 of the data line assembly are separated from each other in the channel region of the TFT. Also, the intermediate layer 55 of the data line assembly and the contact layer pattern 56 for the drain electrode are separated from each other. However, the semiconductor pattern 42 for the TFT is connected to form the channel of the TFT. A passivation layer 70 is formed on the data wirings 62, 64, 65, 66 and 68.

The passivation layer 70 has contact holes 76, 78 and 72 and another contact hole 74. The drain electrode 66, the data pad 64 and the conductive pattern 68 for the storage capacitor are exposed through the contact holes 76, 78 and 72. The gate pad 24 and the gate insulating layer 30 are exposed through another contact hole 74.

A pixel electrode 82 is formed on the passivation layer. The pixel electrode 82 receives an image signal from the TFT to form electric field with a common electrode. The pixel electrode 82 has transparent conductive material such as ITO. The pixel electrode 82 is electrically connected to the drain electrode 66 through the contact hole 76 to receive the image signal. The pixel electrode 82 is overlapped with the gate line 22 and the data line 62 to increase aperture ratio. The gate line 22 and the data line 62 are adjacent to the pixel electrode 82. The pixel electrode 82 may not be overlapped with the gate line 22 or the data line 62. The pixel electrode 82 is connected to the conductive pattern for the storage capacitor through the contact hole 72 to transmit the image signal to the conductive pattern 64. An auxiliary gate pad 86 and an auxiliary data pad 88 are connected to the gate pad 24 and the data pad 68 through the contact holes 74 and 78, respectively. The auxiliary gate pad 86 and the auxiliary data pad 88 increase a cohesive strength between the pads 24, 68 and external circuit apparatus. The auxiliary gate pad 86 and the auxiliary data pad 88 also protect the pads 24 and 68, respectively. However, the auxiliary gate pad 86 and the auxiliary data pad 88 may be omitted.

Hereinafter, referring to FIGS. 9 to 18B, a method of manufacturing the TFT substrate for the LCD apparatus according to an exemplary embodiment of the present invention using 4 masks will be disclosed.

Referring to FIGS. 11A and 11A, a metal such as Zr, Ti, Hf, V, Ta, Ni, Cr, Nb, Co, Mn, Mo, W, Rh, Pd, Pt. etc. is deposited on a substrate 10 to form diffusion barrier layers 221, 241, 261 and 281. The thickness of the metal layer is from about 50 Å to 1,000 Å. A copper alloy layer is formed on the diffusion barrier layers 221, 241, 261 and 281 for forming gate wiring layers 222, 242, 262 and 282. The copper alloy layer includes the material from about 0.5 at % to about 15 at %, which is used to form the diffusion barrier layers 221, 241, 261 and 281. Gate wirings and a storage capacitor line 28 are formed by means of a photolithography process. The gate wirings have a gate line 22, a gate pad 24 and a gate electrode 26.

Figure 12B:
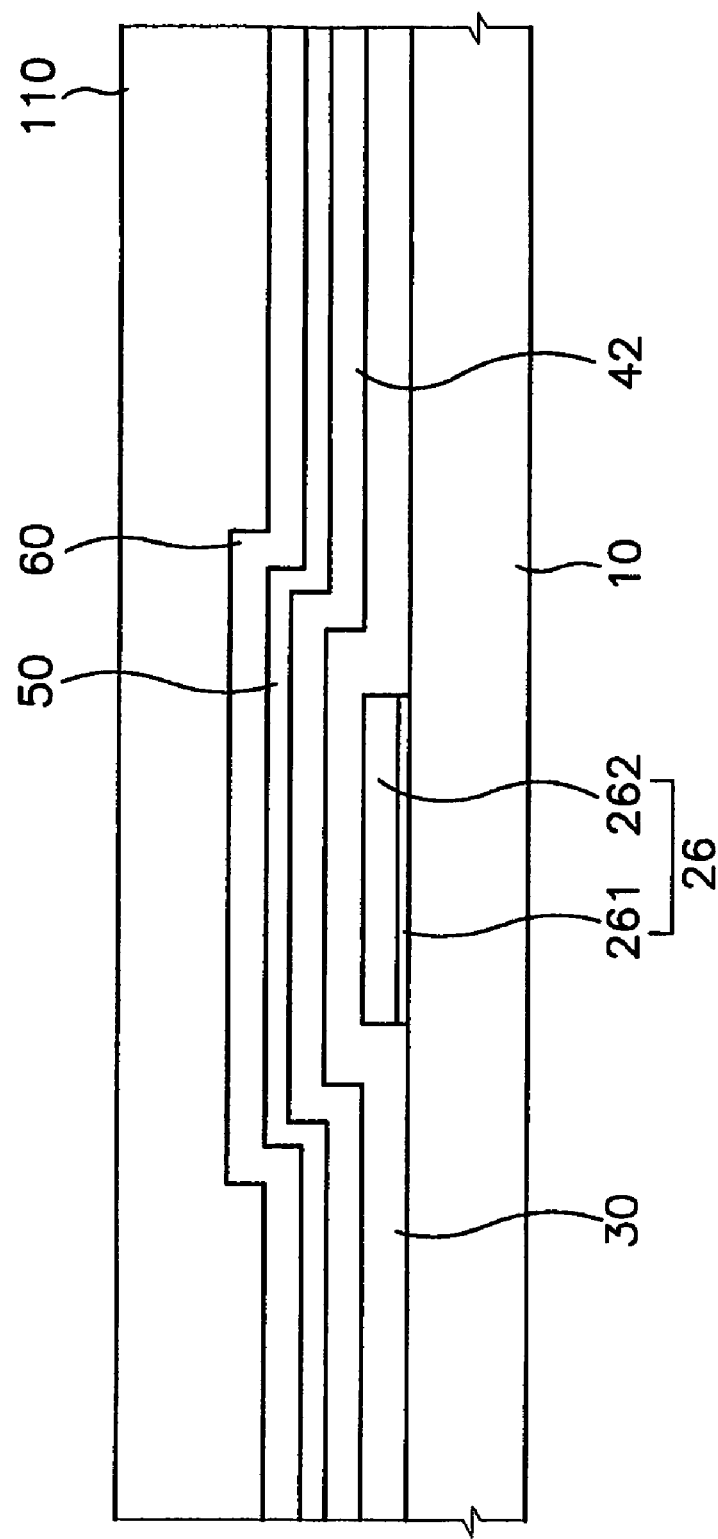

Referring to FIGS. 12A and 12B, a gate insulating layer 30 is then formed. A semiconductor layer 40 is formed on the gate insulating layer 30. An intermediate layer 50 is formed on the semiconductor layer 40. The gate insulating layer 30, the semiconductor layer 40 and the intermediate layer 50 are formed by a chemical vapor deposition. A thickness of the gate insulating layer 30 is from about 1,500 Å to about 5,000 Å, a thickness of the semiconductor layer 40 is from about 500 Å to about 2,000 Å, and a thickness of the intermediate layer 50 is from about 300 Å to about 600 Å. The gate insulating layer 30, the semiconductor layer 40 and the intermediate layer 50 include silicon nitride. MoW is deposited on the intermediate layer 50 by sputtering to form a conductive layer 60. A photoresist film 110 is then formed on the conductive layer 60. The thickness of the photoresist film 110 is from about 1 μm to about 2 μm.

Figure 13A:
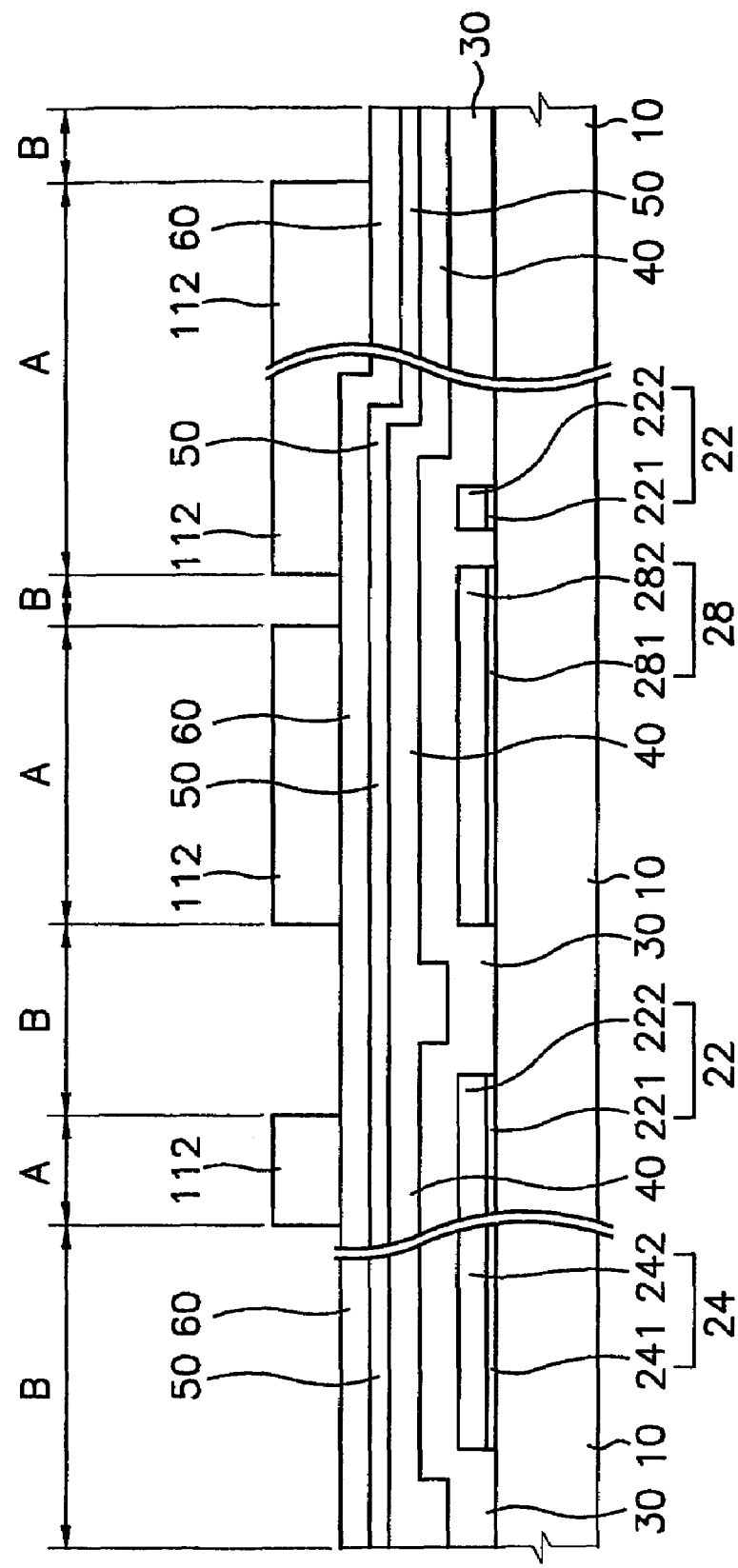
Figure 13B:
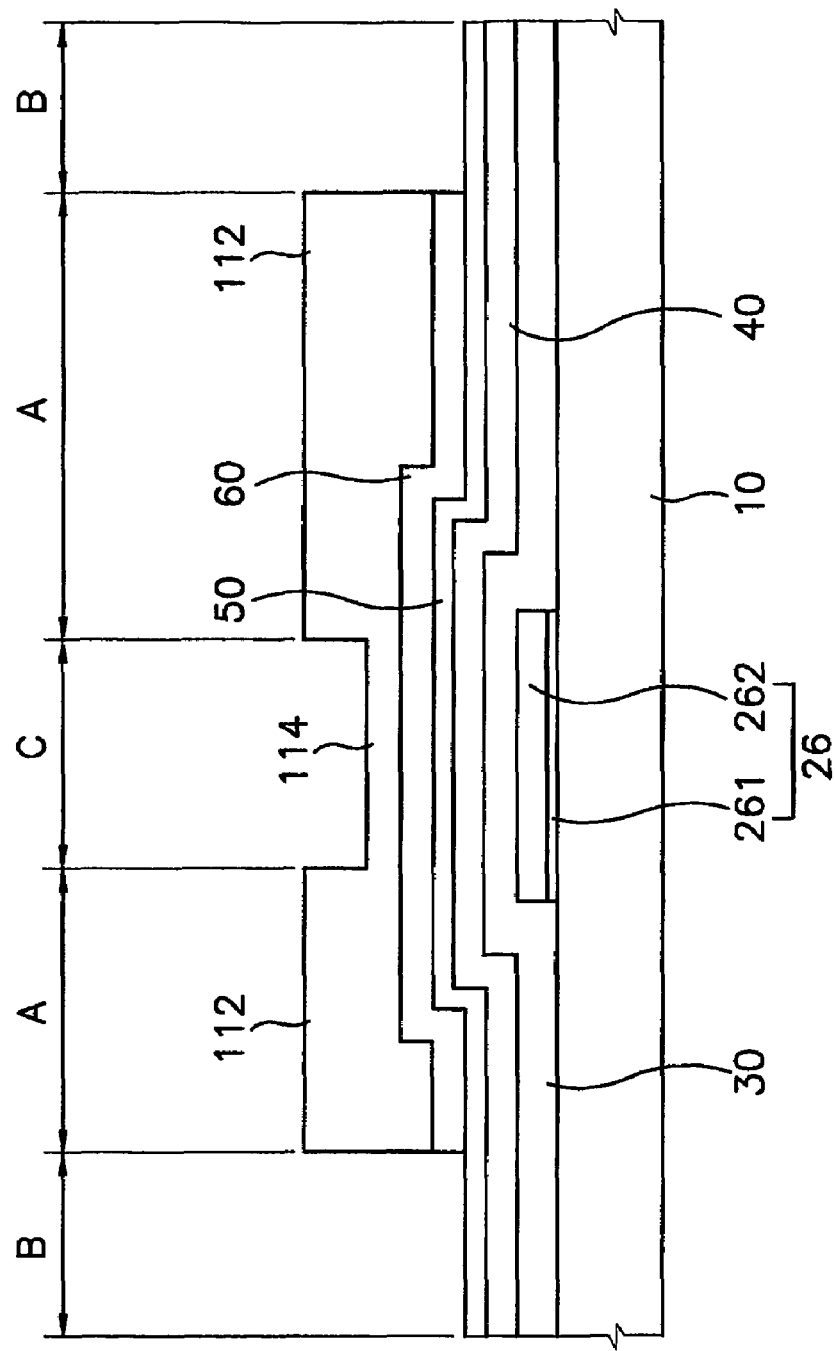

Referring to FIGS. 13A and 13B, photoresist film patterns 112 and 114 are then formed by means of an exposure process and a developing process. The exposure process is performed using a mask. A thickness of a first region 114 of the photoresist film patterns 112 and 114 are thinner than a thickness of a second region 112 of the photoresist film patterns 112 and 114. The first region 114 is disposed on a channel region 'C' of a TFT. The channel region of the TFT is disposed between the source electrode 65 and the drain electrode 66. The second region is disposed on a data wiring assembly 'A' on which data wirings 62, 64, 65, 66 and 68 will be formed. A photoresist film disposed on the remaining region 'B' is removed. The remaining region 'B' is different from the first region 114 and the second region 112. A ratio of the remaining thickness of the photoresist film of the first region 114 to the second region 112 varies corresponding to a condition of an etching process. Preferably, the ratio of the first region 114 to the second region 112 is no more than about a half. The remaining thickness of the photoresist film of the first region 114 may be no more than about 4,000 Å.

The thickness of the photoresist film may be determined by means of a control of a light intensity of the first region 114. The light intensity may be controlled by means of a pattern having a slit, a pattern having a lattice shape or a translucent film.

Preferably, an interval between lines of the pattern, or an interval between the patterns is smaller than a resolution of exposure apparatus. The interval between the patterns may be an interval between the slits. When a translucent film is used, transmittance of a mask may be determined by a transmittance and a thickness of the translucent film.

When the photoresist film is exposed through the mask, polymers at a portion of the photoresist film directly exposed by the light are fully decomposed, polymers at a portion of the photoresist film on which the translucent film is disposed are partially decomposed, and polymers at a masked portion of the photoresist film are not decomposed.

When the photoresist film is developed, a portion in which high polymers are not decomposed remains. Therefore, a thickness of photoresist film in partially exposed portion is thinner than a thickness of photoresist film in unexposed portion. When exposing time is too long, all the high polymers are decomposed. Therefore, the exposing time needs to be controlled so that all the high polymers are not decomposed.

A reflowable material may be used to form a thin photoresist film 114. The thin photoresist film 114 may be formed by means of an exposure process, developing process and reflowing process, thereby reflowing an unexposed portion of the photoresist film into an exposed portion of the photoresist film. The exposure process is performed using a conventional mask. The mask has a region through which a light passes, and another region through which a light does not pass.

The photoresist film pattern 114 and the layers disposed under the photoresist film pattern 114 are then etched. The layers disposed under the photoresist film pattern 114 have the conductive layer 60, an intermediate layer 50 and the semiconductor layer 40. The data wirings and the layers disposed under the data wirings remain in the data wiring region 'A'. The semiconductor layer remains in the channel region 'C'. A conductive layer, an intermediate layer and a semiconductor layer in the remaining region 'B' are removed so that the gate insulating layer 30 is exposed. The remaining region 'B' is different from the data wiring region 'A' or the channel region 'C'.

Figure 14A:
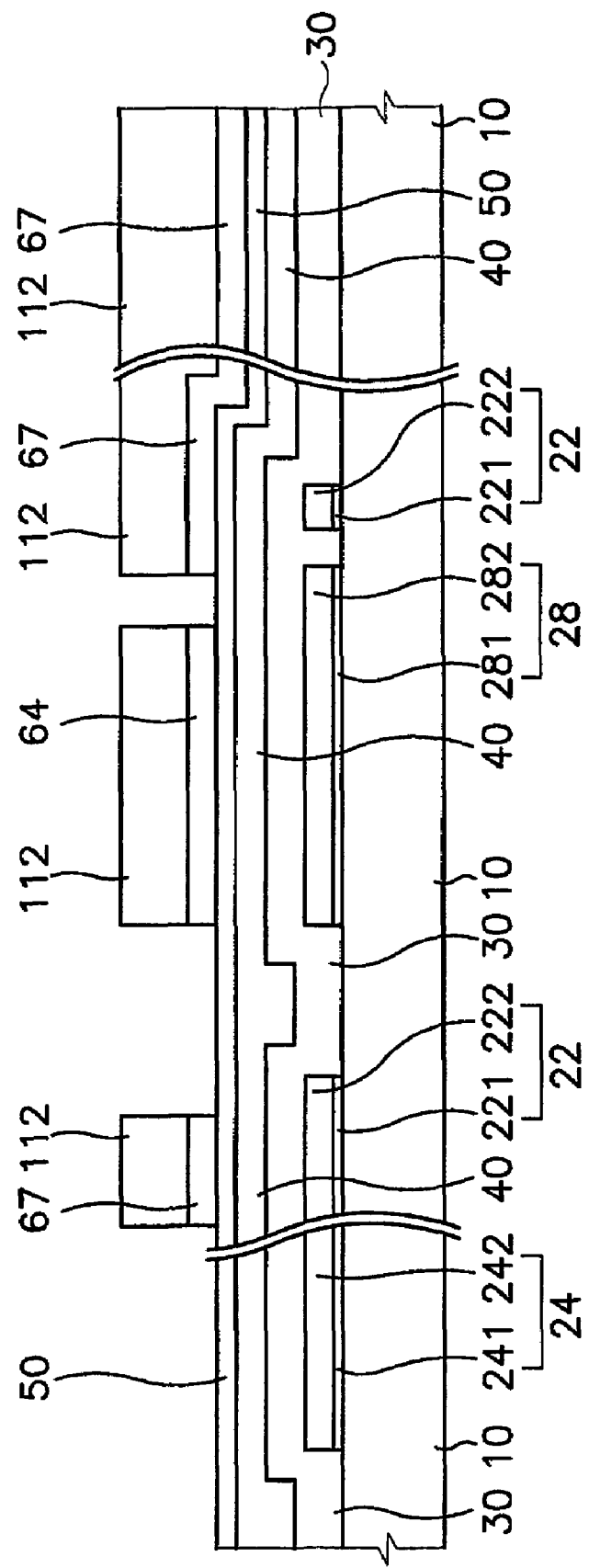
Figure 14B:
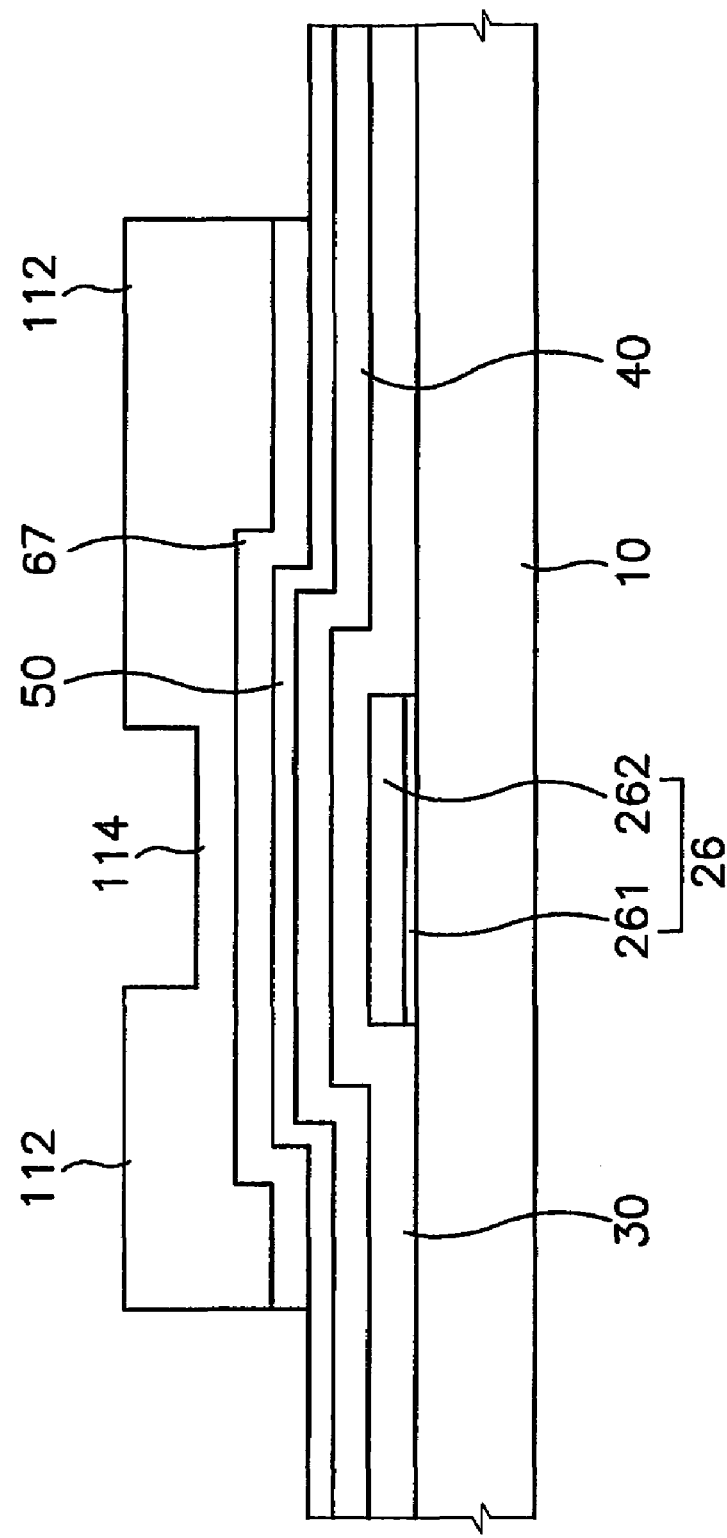

Referring to FIGS. 14A and 14B, the exposed conductive layer 60 of the remaining region 'B' is then removed to expose the intermediate layer 50. The exposed conductive layer 60 is disposed on the intermediate layer 50. A dry etching or a wet etching may be used. Preferably, the conductive layer 60 is etched under a condition that the photoresist film patterns 112 and 114 are substantially not etched. However, in dry etching, the conductive layer 60 may not be etched without etching the photoresist film patterns 112 and 114 so that the conductive layer 60 is etched with the photoresist film patterns 112 and 114. A thickness of a first region 114 in dry etching is thicker than a thickness of a first region 114 in wet etching so that the conductive layer 60 is not exposed by means of etching the first region in dry etching.

Referring to FIGS. 14A and 14B, the conductive layer of the channel region 'C' and the conductive layer of the data wiring region 'A' remain, but the conductive layer 60 in the remaining region 'B' is removed, thereby exposing the intermediate layer 50. The conductive layers of the channel region 'C' and the data wiring region 'A' include the conductive pattern 67 for source/drain, and the conductive pattern 68 for the storage capacitor. The remaining conductive patterns 67 and 64 have shapes substantially identical to the data wirings 62, 64, 65, 66 and 68 except the source electrode 65 and the drain electrode 66. The source electrode 65 and the drain electrode 66 are connected in the remaining conductive patterns. When the dry etching is performed, the photoresist film patterns 112 and 114 are also etched.

Figure 15A:
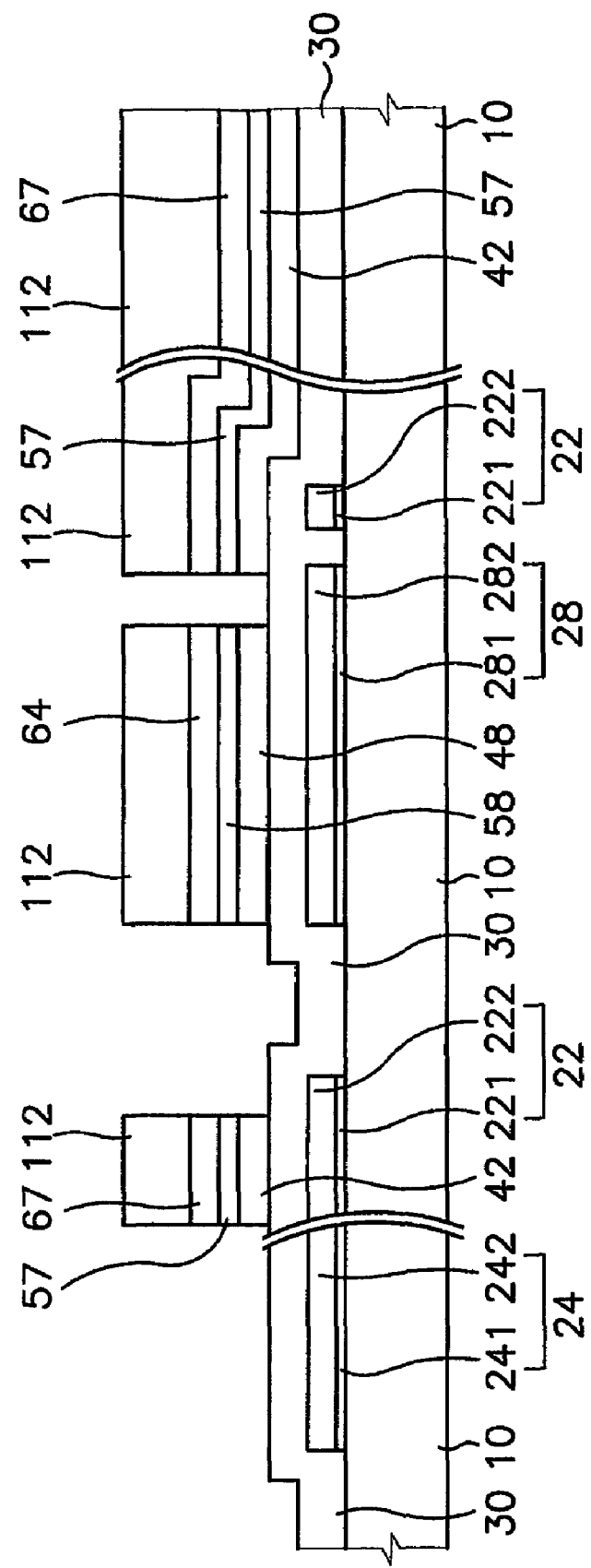
Figure 15B:
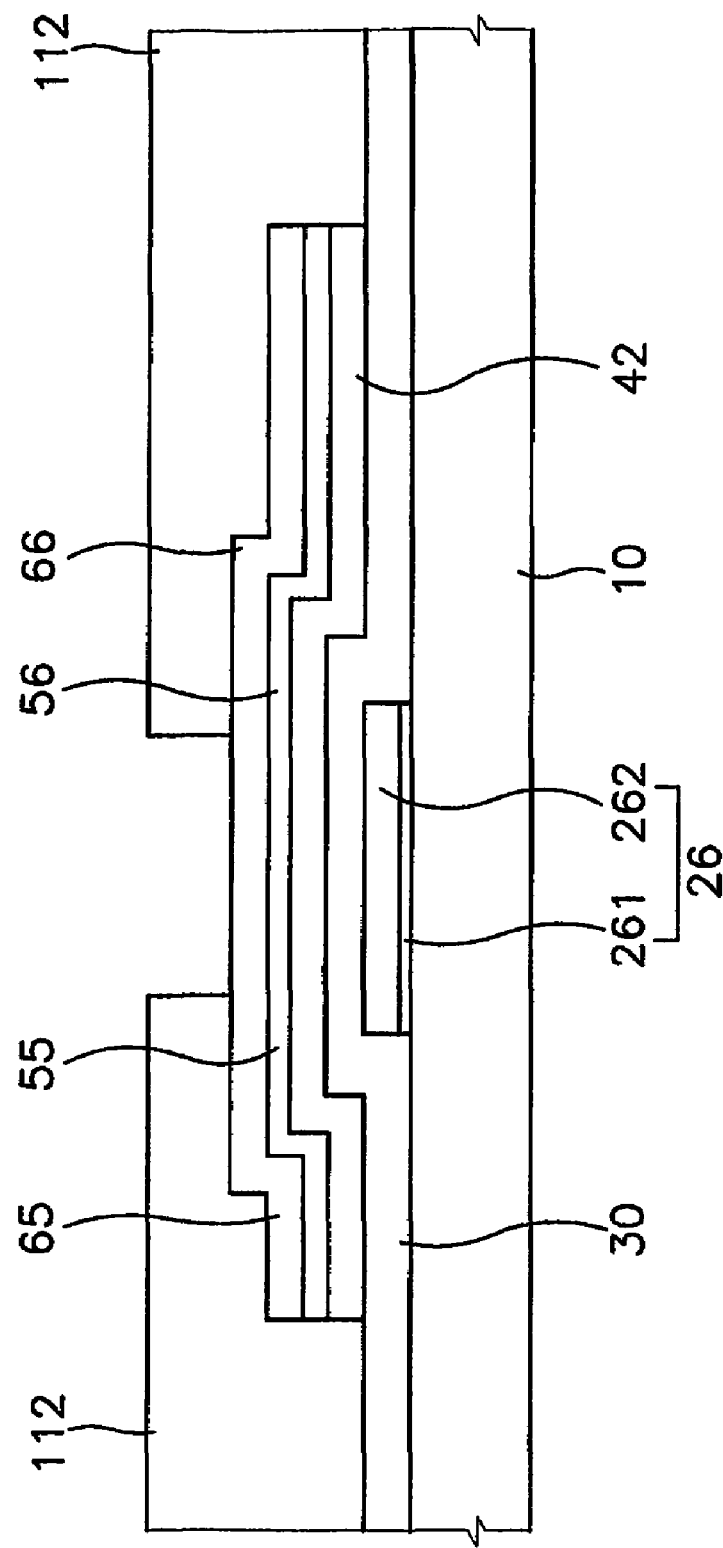

Referring to FIGS. 15A and 15B, the exposed intermediate layer 50 in the remaining region 'B', the exposed semiconductor layer 40 in the remaining region 'B' and a first region of the photoresist film are then removed by means of a dry etching. The semiconductor region 40 is disposed under the intermediate layer. During the etching, the gate insulating layer 30 is substantially not etched. An etching rate of the semiconductor layer 40 is substantially identical to an etching rate of the intermediate layer 50. Preferably, an etching rate of the photoresist patterns 112 and 114 is substantially identical to the etching rate of the semiconductor layer 40. For example, a mixed gas of $SF_6$ and HCl or a mixed gas of $SF_6$ and $O_2$ may be used. When the etching rate of the photoresist film patterns 112 and 114 is substantially identical to the etching rate of the semiconductor layer 40, a thickness of the first region 114 is no less than a summation of a thickness of the semiconductor layer 40 and a thickness of the intermediate layer 50.

Referring to FIGS. 15A and 15B, a first portion of the channel region 'C' is removed to expose the conductive pattern for source/drain, and an intermediate region 50 in the remaining region 'B' and a semiconductor region 40 in the remaining region 'B' are removed to expose the gate insulating layer 30. A second region 112 of the data wiring assembly 'A' is etched to decrease a thickness of the second region 112 of the data wiring assembly 'A'. Therefore, semiconductor patterns 42 and 48 are formed. An intermediate layer pattern under the conductive pattern of source/drain and an intermediate layer pattern under the conductive pattern of a storage capacitor are represented by reference numerals 57 and 58, respectively.

A remaining photoresist film on a surface of the conductive pattern of source/drain in the channel region 'C' is then removed by ashing process.

Figure 16A:
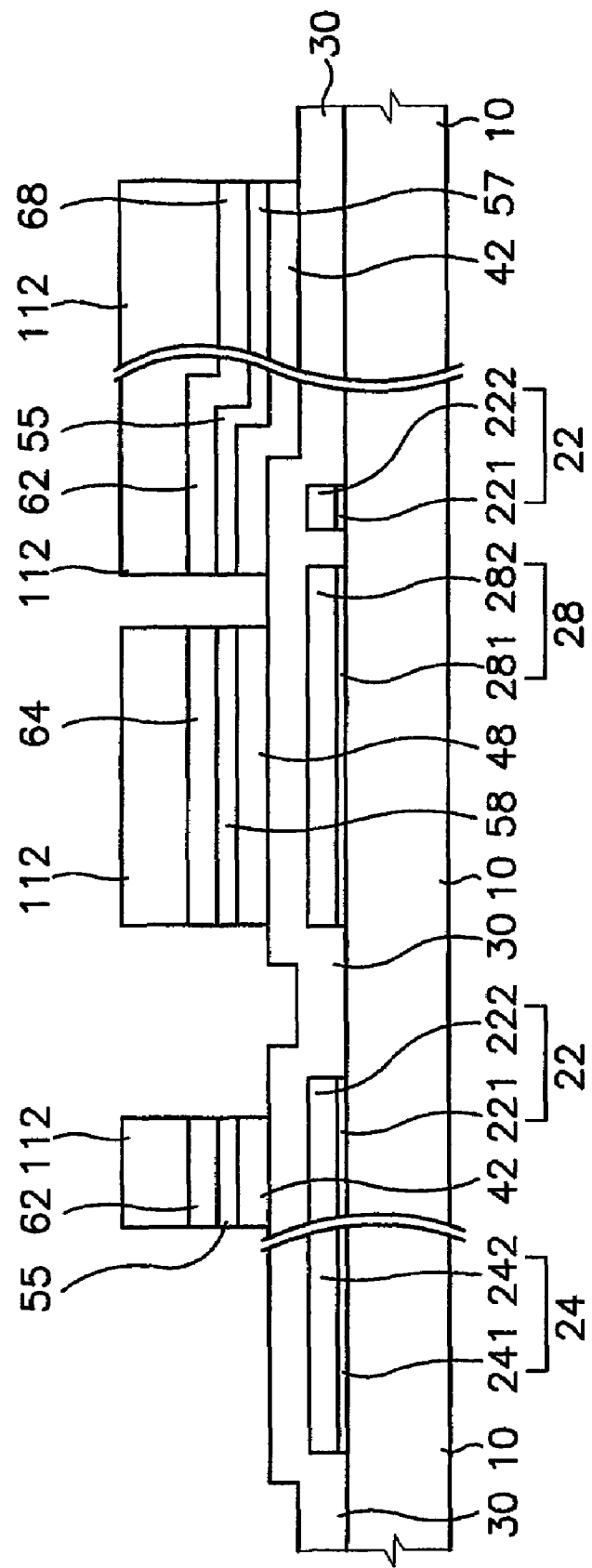

Referring to FIGS. 16A and 16B, a conductive pattern for source/drain in the channel region 'C' and an intermediate pattern for source/drain in the channel region 'C' are etched, thereby being removed. The intermediate pattern of the source/drain is disposed under the conductive pattern for the source/drain in the channel region 'C'.

The conductive pattern for the source/drain and the intermediate pattern may be dry etched. Preferably, etching selectivity between the conductive pattern for the source/drain and the intermediate pattern is big in the dry etching because the end point detection of the dry etching is difficult. Therefore, when etching selectivity is not big, a control of a thickness of the semiconductor pattern remaining in the channel region 'C' is not easy.

A dry etching may also be performed with wet etching. The conductive pattern for the source/drain may be wet etched, and the intermediate pattern 57 may be dry etched. When the dry etching is performed with the wet etching, a sidewall of the conductive pattern for the source/drain is wet etched, and the intermediate layer pattern 57 is substantially not etched, so that a stepwise shape is formed. A mixed gas of $SF_4$ and HCl, or a mixed gas of $CF_4$ and $O_2$ may be used to etch the intermediate layer pattern 57 and the semiconductor pattern 42. A semiconductor pattern having a uniform thickness may be formed by means of a mixed gas of $CF_4$ and $O_2$. Referring to FIG. 16B, a portion of the semiconductor pattern 42 may be removed to decrease a thickness of the semiconductor pattern, and a second region 112 of the photoresist film pattern may be etched to decrease a thickness of the second region 112 of the photoresist film pattern. Preferably, the gate insulating layer 30 is not etched, and a thickness of the photoresist film pattern is thick enough so that the second region 112 is not etched so that the data wirings 62, 64, 65, 66 and 68 are coated by the photoresist film pattern.

Therefore, the source electrode 65 and the drain electrode 66 are separated to form the data wirings 62, 64, 65, 66 and 68 and the contact layer patterns 55, 56 and 58. The data wirings 62, 64, 65, 66 and 68 are disposed on the contact layer patterns 55, 56 and 58.

A second region of the photoresist film remaining on the data wiring assembly 'A' is then removed. However, the second region may be removed before the conductive pattern 67 of the source/drain in the channel region 'C' is removed. The second region is removed after the intermediate layer pattern 57 under the conductive pattern 56 is removed.

Figure 17B:
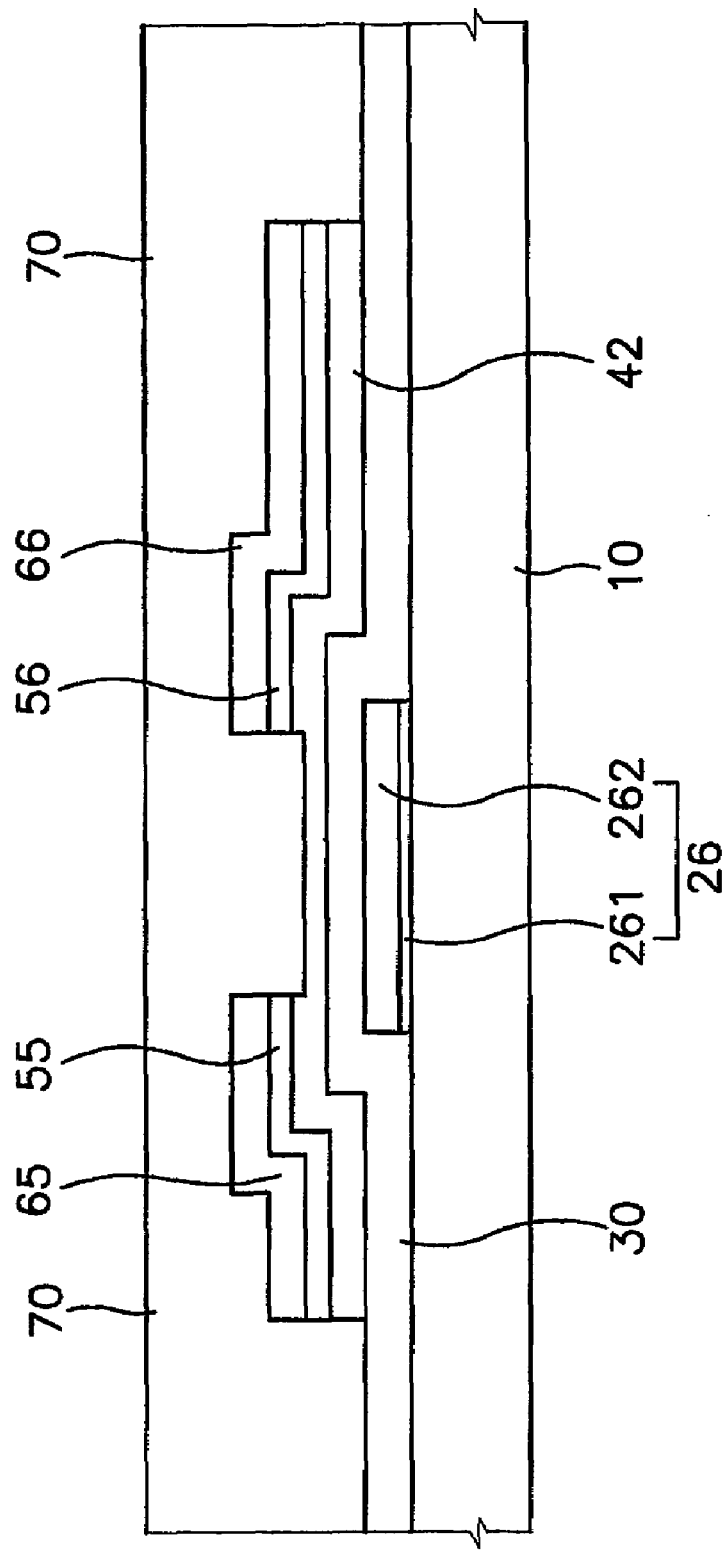

As mentioned above, a dry etching may be performed solely, or a wet etching may be performed with a dry etching. When the dry etching is performed solely, manufacturing process is simple but etching condition is incontrollable. However, when the wet etching is performed with the dry etching, manufacturing process is complex, but etching condition is controllable. Referring to FIGS. 17A and 17B, a passivation layer 70 is then formed.

Figure 18A:
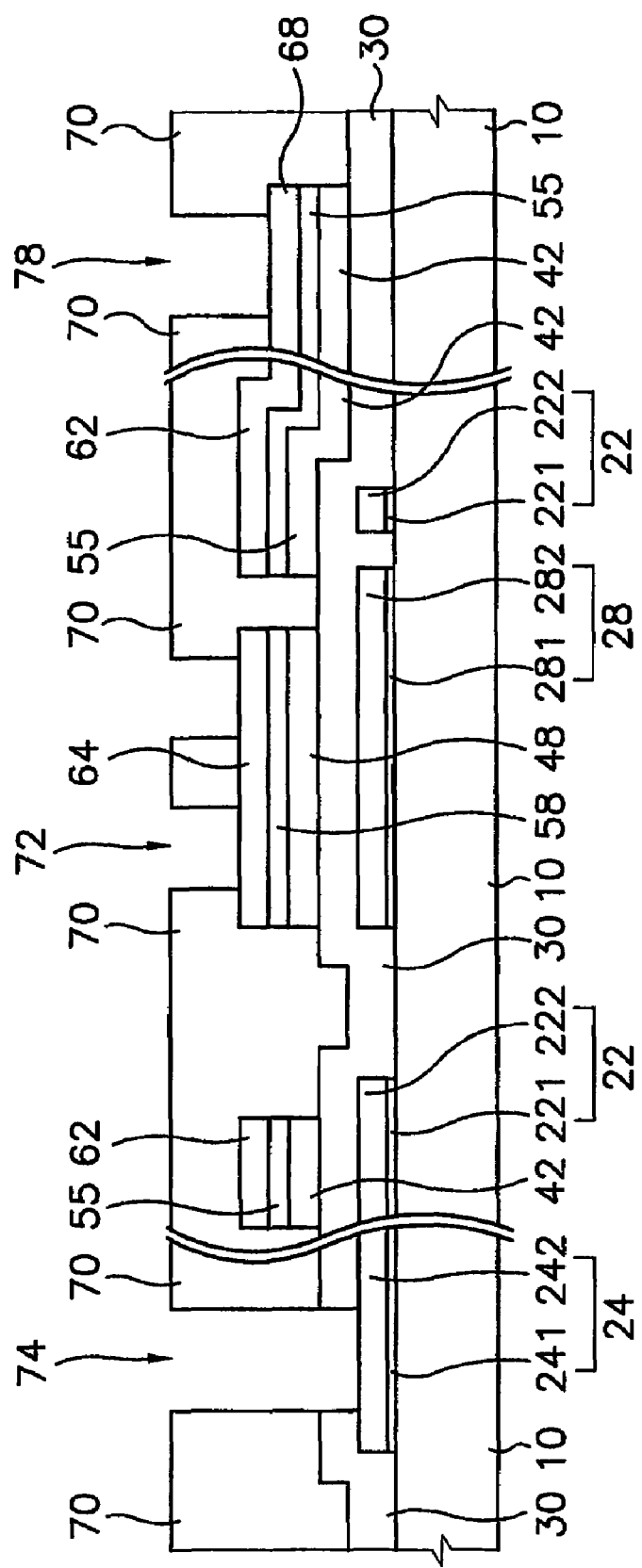
Figure 18B:
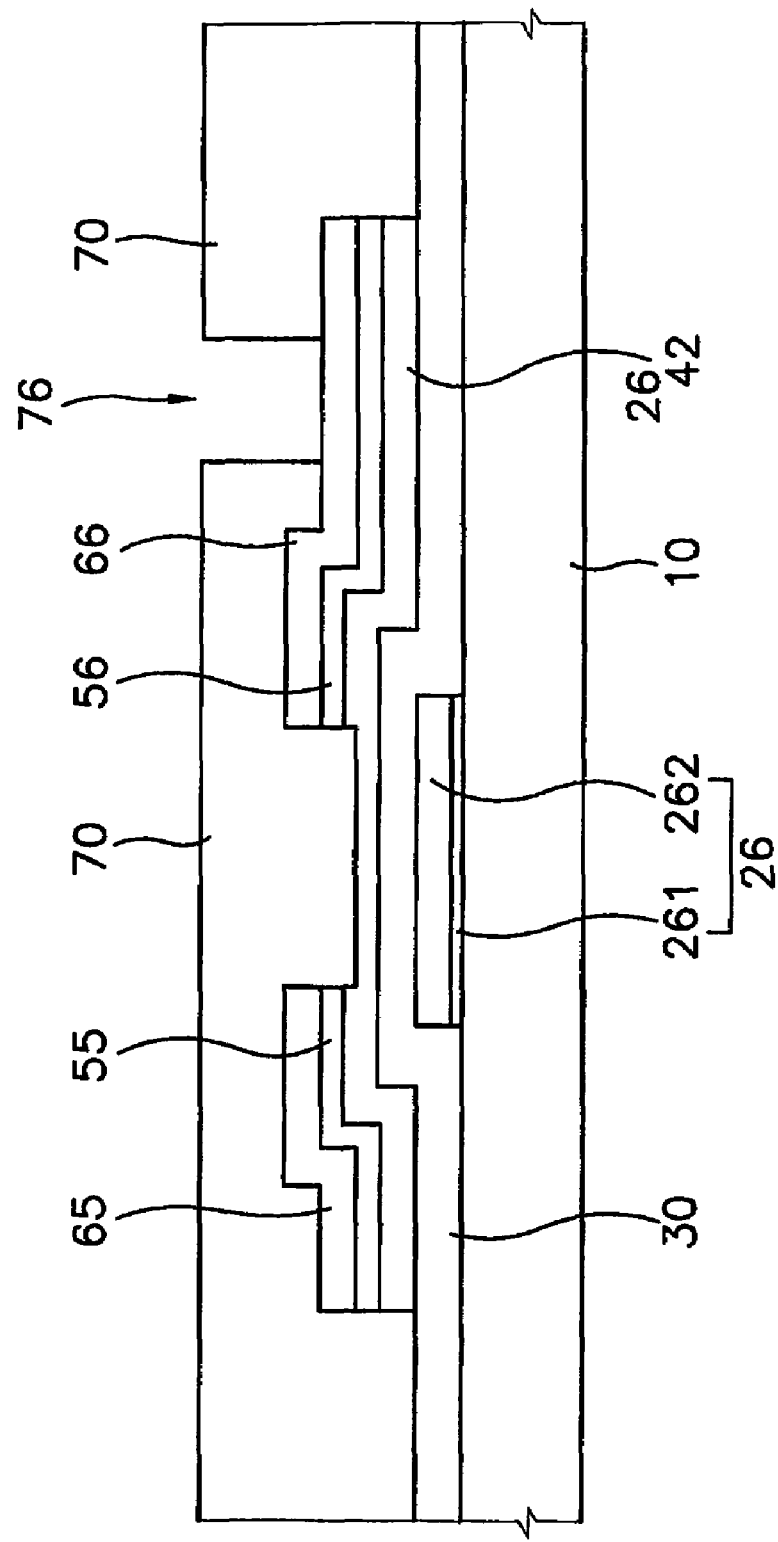

Referring to FIGS. 18A and 18B, the passivation layer 70 and the gate insulating layer 30 are etched to form contact holes 76, 74, 78 and 72 through which the drain electrode 66, the gate pad 24, the data pad 68 and the conductive pattern of a storage capacitor 64 are exposed, respectively. The etching process is performed by means of a lithography process. Dimensions of contact holes 74 and 78 are no more than about 2 mm×60 μm. The pads 24 and 68 are exposed through the contact holes 74 and 78. Preferably dimensions of the contact holes 74 and 78 are no less than about 0.5 mm×15 μm.

Referring to FIGS. 9 to 11, ITO layer is then deposited to a thickness from about 400 Å to about 500 Å. The ITO layer is then patterned. Therefore, a pixel electrode 82, an auxiliary gate pad 86 and an auxiliary data pad 88 are formed by means of a photolithography process. The pixel electrode 82 is connected to the drain electrode 66 and the conductive pattern of the storage capacitor, and the auxiliary gate pad 86 is connected to the gate pad 24. The auxiliary data pad 88 is connected to the data pad 68.

Preferably, nitrogen gas is used in a pre-heating process. The pre-heating is performed before the ITO is deposited. The nitrogen gas prevents a formation of a metal oxide layer. The metal oxide layer may be formed on an upper portion of metal layers 24, 64, 66 and 68 that are exposed through the contact holes 72, 74, 76 and 78.

According to another exemplary embodiment of the present invention, the data wirings 62, 64, 65, 66 and 68, the contact layer patterns 55, 56 and 68 and the semiconductor patterns 42 and 48 are formed using one mask, and source electrode is separated from the drain electrode, thereby simplifying manufacturing process.

A method according the exemplary embodiments of the present invention may also be applied to an AOC (Array On Color Filter) structure. In the AOC structure, TFT array is formed on color filters.

Figure 19:
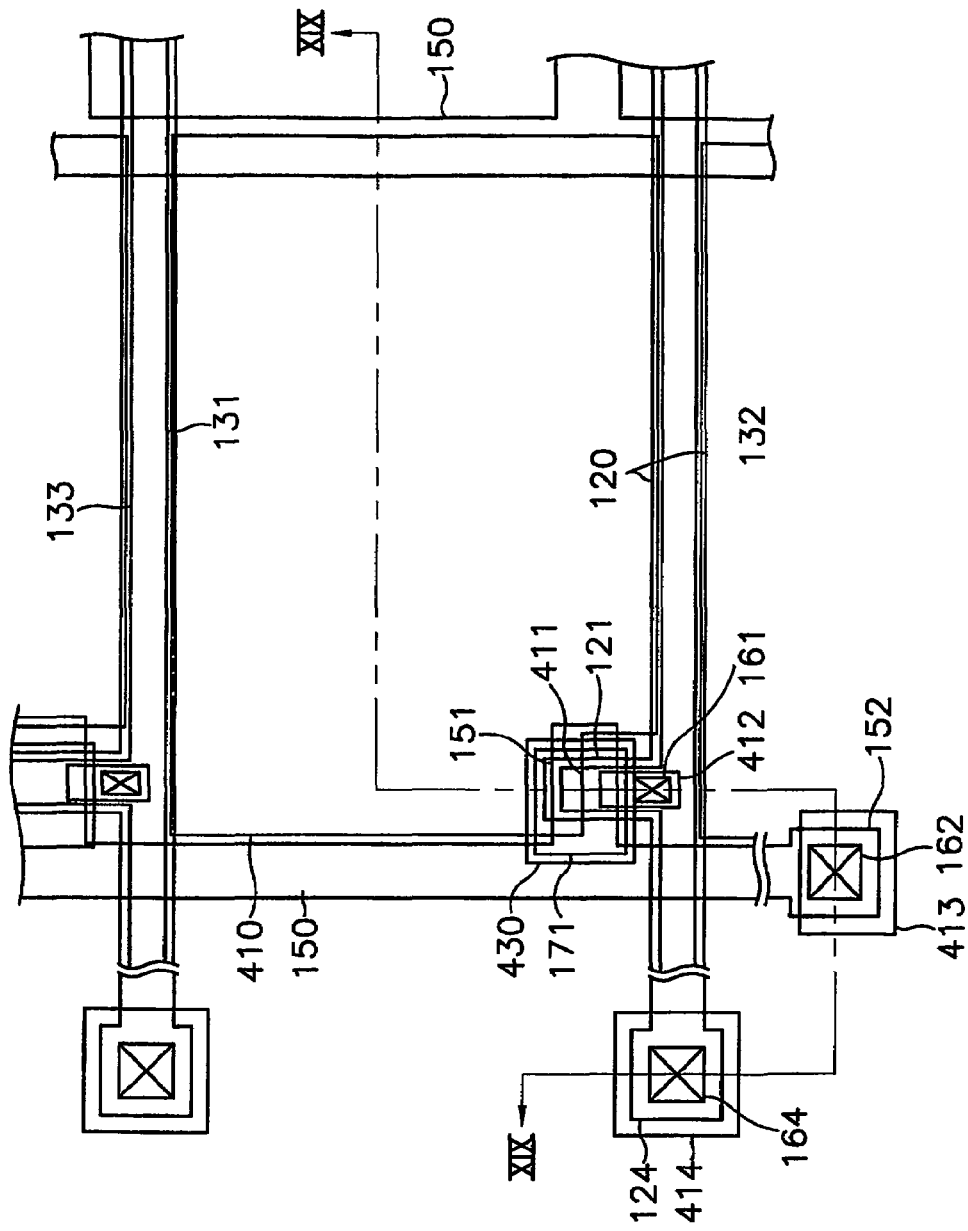
FIG. 19 is a plan view showing a TFT substrate according to another exemplary embodiment of the present invention.
Figure 20:
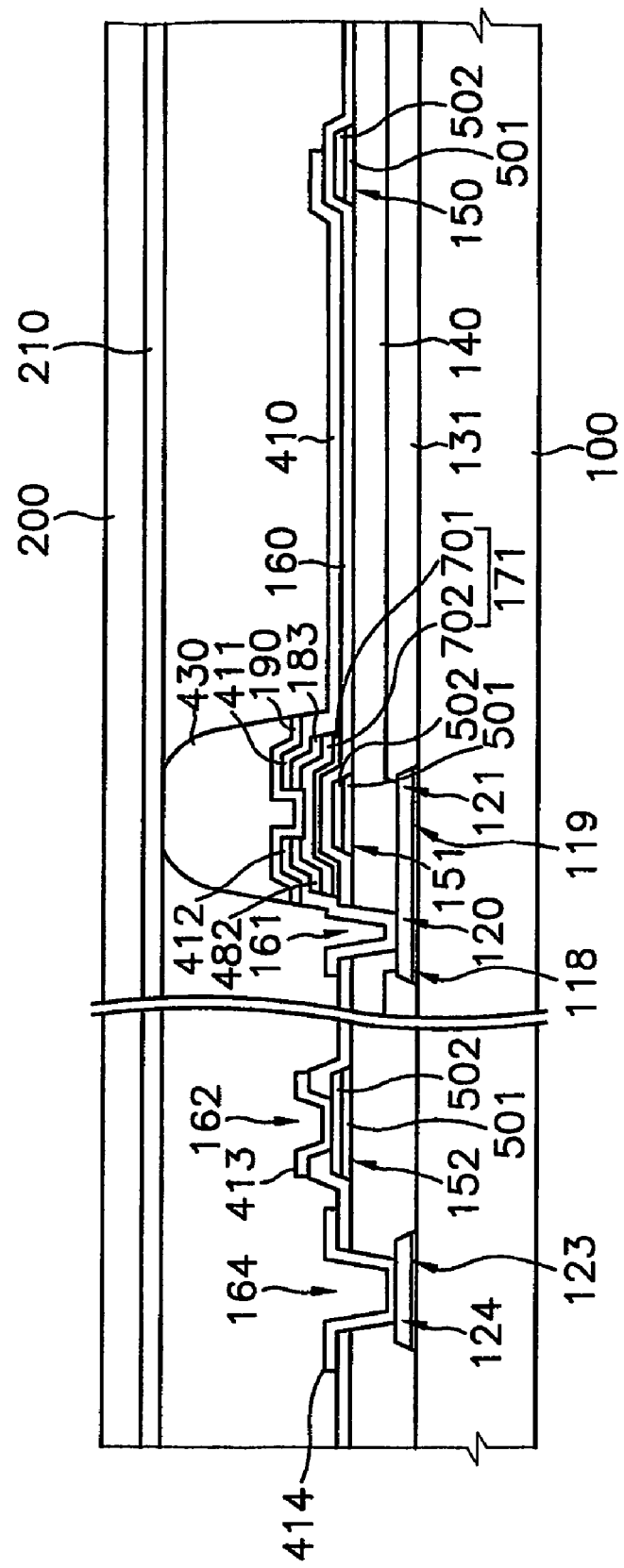
FIG. 20 is a cross-sectional view taken along a line XIX-XIX' shown in FIG. 19.

FIG. 19 is a plan view showing a TFT substrate according to another exemplary embodiment of the present invention, and FIG. 20 is a cross-sectional view taken along a line XIX-XIX' shown in FIG. 19 and an upper substrate facing a lower substrate. The lower substrate is a TFT substrate.

Diffusion barrier layers 118, 119 and 123 and data wirings 120, 121 and 124 including copper alloy are formed on a lower insulating substrate 100.

Data wirings 120, 121 and 124 include a data line 120, a data pad 124 and a black matrix 121. The data line 120 extends in a longitudinal direction with respect to the substrate. The data pad 124 is connected to an end portion of the data line 120 and receives an image signal from outside to transmit the received image signal to the data line 120. The black matrix is divided from the data line 120 and masks a light that is from a lower surface of the substrate 100 to a semiconductor layer 170 of TFT. The black matrix 121 may mask leaked light, and the black matrix 121 may be separated from the data line 120 to form a disconnected wiring. The black matrix 121 has a function substantially identical to a black matrix that masks the leaked light.

A red (R) color filter, a blue (B) color filter and green (G) color filter are formed on the lower insulating substrate 100. Peripheral portions of the color filters 131, 132 and 133 are overlapped with a peripheral portion of the data wirings 120 and 121. The color filters 131, 132 and 133 may be formed over a data line 120.

A buffer layer 140 is formed on the data wirings 120, 121 and 124 and the color filters 131, 132 and 133. The buffer layer 140 prevents the color filters 131, 132 and 133 from outgassing, and the buffer layer 140 also prevents the color filters 131, 132 and 133 from being damaged by heat or plasma energy in subsequent processes. Because the buffer layer 140 separates the data wirings 120, 121 and 124 from the TFT array, lower dielectric constant and thicker thickness are preferable so as to decrease a parasite capacitance.

Gate wirings having a double layered structure are formed on the buffer layer 140. The double layered structure has a lower layer 501 and an upper layer 502. The lower layer 501 has a material such as aluminum and aluminum alloy, and the upper layer 502 has a material such as molybdenum and molybdenum alloy.

The gate wirings include a gate line 150, a gate pad 152 and a gate electrode 151 of a TFT. The gate line 150 extends laterally to intersect the data line 120, thereby defining a pixel. The gate pad 152 is connected to an end portion of the gate line 150 and receives an image signal from outside to transmit the image signal to the gate line 150. The gate line 150 has the gate electrode 151 of TFT.

The gate line 150 is overlapped with a pixel electrode 410 to form a storage capacitor that improves storage capacitance of the pixel. When the storage capacitance formed by overlap of the gate line 150 and the pixel electrode 410 is not enough, a common electrode for a storage capacitor may be formed.

Preferably, when gate wirings are formed in a multi-layered structure, one layer has low resistance and another layer has high adhesiveness. A double layered structure may have Al (or aluminum alloy) and MoW.

A gate insulating layer 160 deposited at a low temperature is formed on the gate wirings 150, 151 and 152 and the buffer layer 140. The gate insulating layer 160 deposited at low temperature may have an organic insulating layer, an amorphous silicon oxide layer formed at a low temperature or an amorphous silicon nitride layer formed at a low temperature. Color filters are formed on the lower substrate of a TFT structure according to another exemplary embodiments of the present invention. A gate insulating layer is not deposited at a high temperature, but a gate insulating layer is deposited at a low temperature such as a temperature not more than or equal to about 250° C.

A semiconductor layer 171 of a double layered structure is formed on the gate insulating layer 160 of the gate electrode 151. The semiconductor layer 171 of the double layered structure has an island shape. A lower semiconductor layer 701 of the semiconductor layer 171 includes amorphous silicon having a high band gap energy, and an upper semiconductor layer 702 of the semiconductor layer 171 includes amorphous silicon having a lower band gap energy than the band gap energy of the lower semiconductor layer 701. For example, a band gap energy of the lower semiconductor layer 701 may be from about 1.9 eV to about 2.1 eV, and a band gap energy of the upper semiconductor layer 702 may be from about 1.7 eV to about 1.8 eV. A thickness of the lower semiconductor layer 701 may be from about 50 Å to about 200 Å, and a thickness of the upper semiconductor layer 702 may be from about 1,000 Å to about 2,000 Å.

A band gap energy offset is formed between the upper semiconductor layer 702 and the lower semiconductor layer 701. The lower semiconductor layer 701 has different band gap from the upper semiconductor layer 702. The band gap energy offset is substantially identical to a difference of the band gap energy. When the TFT is turned-on, a channel is formed in a band offset region disposed between the lower semiconductor layer 701 and the upper semiconductor layer 702. Atomic structures of the band offset region are substantially identical to each other so that the band offset region has fewer defects. Therefore, characteristics of a TFT are improved. The semiconductor layer 171 may have a mono layered structure.

Ohmic contact layers 182 and 183 are formed on the semiconductor layer 171. The ohmic contact layers 182 and 183 have n+ amorphous silicon, n+ microcrystalline silicon or an n+ metal silicide doped with impurities by a high concentration, and the ohmic contact layers 182 and 183 are separated from each other.

Pixel wirings 410, 411 and 412 are formed on the ohmic contact layers. The pixel wirings 410, 411 and 412 have a source electrode 412, a drain electrode 411 and a pixel electrode 410. The source electrode 412 is connected to a data line 120 through a contact hole 161 that is formed in a gate insulating layer 160 and a buffer layer 140. The drain electrode 411 is connected to the pixel electrode 410, and transmits an image signal from the TFT to the pixel electrode. The pixel wirings 410, 411 and 412 have ITO. The ITO is a transparent conductive material.

An auxiliary gate pad 413 and an auxiliary data pad 414 are connected to the gate pad 152 and the data pad 124 through contact holes 162 and 164, respectively. The auxiliary gate pad 413 and the auxiliary data pad 414 are formed as a layer substantially identical to the pixel wirings 410, 411 and 412. The auxiliary gate pad 413 makes direct contact with a molybdenum-tungsten alloy layer, and the auxiliary data pad 414 makes direct contact with a copper alloy layer. The molybdenum-tungsten alloy layer is an upper layer 502 of the gate pad 152, and the copper alloy layer is an upper layer 202 of the data pad 124. The pixel electrode 410 is overlapped with a gate line 150 adjacent to the pixel electrode 410 and a data line 120 adjacent to the pixel electrode 410, thereby increasing the aperture ratio. The pixel electrode 410 may not be overlapped with the gate line 150 or the data line 120.

A passivation layer 190 is formed on the source electrode 412 and a drain electrode 411, and a photoresist color organic layer 430 is formed on the passivation layer 190. The passivation layer 190 protects the TFT. The photoresist color organic layer 430 has a deep color and a good light absorbance. The color organic layer 430 masks a light incident into the semiconductor layer 171 of the TFT, and the color organic layer 430 controls a height of the color organic layer 430. Therefore, the color organic layer 430 maintains an interval between the lower insulating substrate 100 and an upper insulating layer facing the lower insulating substrate 100. That is, the color organic layer 430 is used as a spacer. The passivation layer 190 and the organic layer 430 may be formed along the gate line and the data line 120, respectively. The organic layer 430 may also mask a light that is leaked adjacent to the gate wirings and the data wirings.

The upper substrate 200 has ITO or IZO, and a common electrode 210 is formed over the upper substrate 200. The common electrode 210 generates an electric field with the pixel electrode 410.

Hereinafter, referring to FIGS. 19 to 28, a method of manufacturing the TFT substrate according another exemplary embodiment of the present invention will be disclosed.

Figure 21:
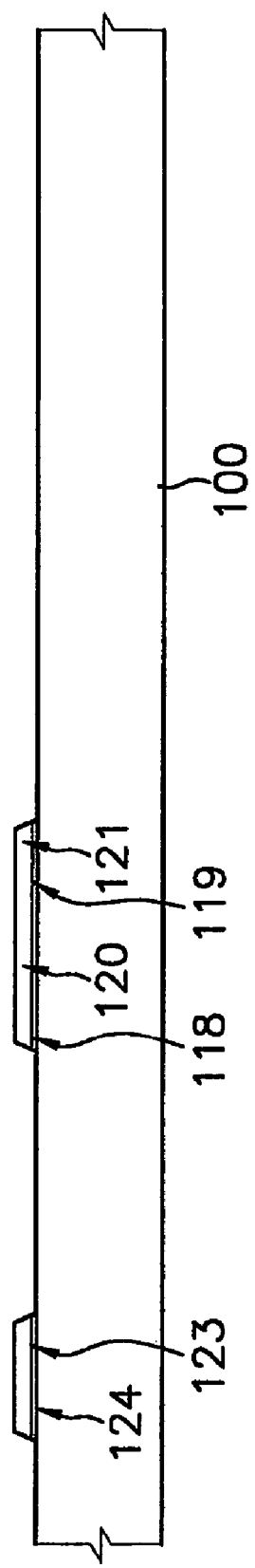
FIGS. 21 to 28 are cross-sectional views showing a process of manufacturing the TFT substrate of FIG. 20.

Referring to FIG. 21, a metal such as Zr, Ti, Hf, V, Ta, Ni, Cr, Nb, Co, Mn, Mo, W, Rh, Pd, Pt, etc. is deposited on a lower insulating substrate 100 to form diffusion barrier layers 120, 121 and 124. A thickness of the diffusion barrier layers 120, 121 and 124 is from about 50 Å to 1,000 Å. An alloy including copper and the material from about 0.5 at % to about 15 at % is then deposited on the diffusion barrier layers 120, 121 and 124. The material is used to form the diffusion barrier layer. A photoresist pattern is then formed on the deposited alloy. The deposited alloy is then dry etched or wet etched. Therefore, data wirings 120, 121 and 124 are formed on the lower insulating substrate 100 by a photolithography process using a mask. The data wirings 120, 121 and 124 have a data line 120, a data pad 124 and a black matrix 121. The diffusion barrier layer is then heat treated at a temperature of about 400° C. at an atmospheric pressure to form a silicide.

Figure 22:
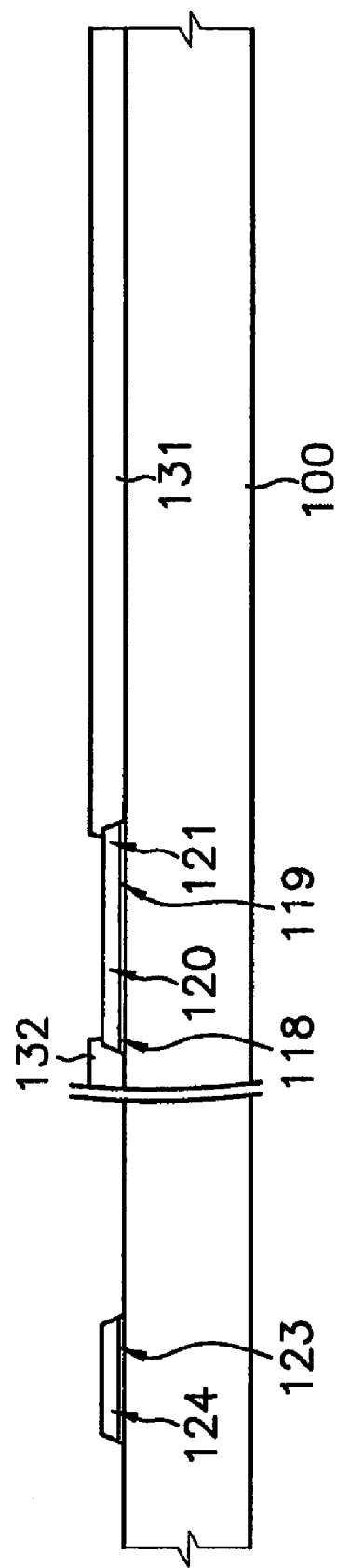
Figure 23:
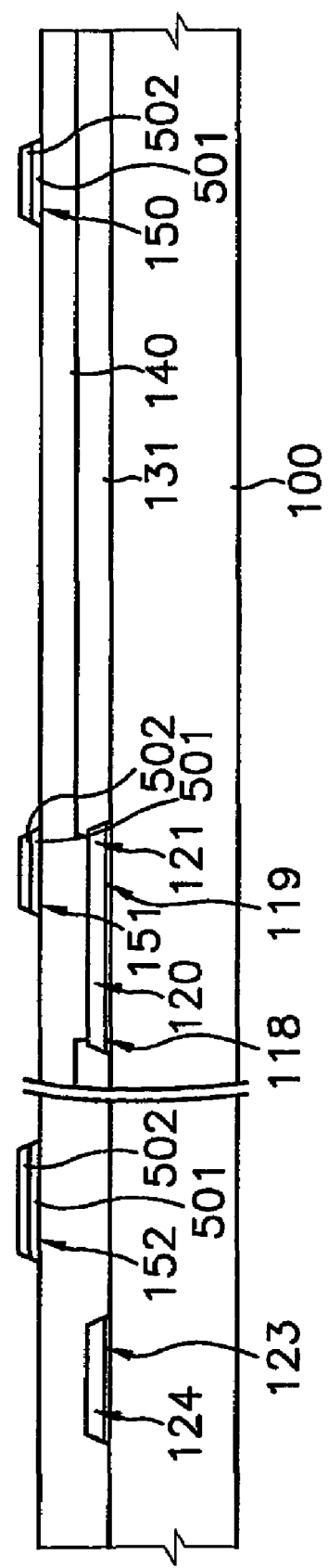

Referring to FIG. 22, photoresist materials including a red (R) colorant, a green (G) colorant and a blue (B) colorant are then coated successively and patterned. Therefore, an R color filter 131, a G color filter 132 and a B color filter 133 are formed by means of a photo process using masks, successively.

Then, three masks are used to form the R color filter 131, the G color filter 132 and the B color filter 133. However, one mask may be used to form the R color filter 131, the G color filter 132 and the B color filter 133, thereby reducing cost. A laser photo process or a printing method may also be used without a mask, thereby minimizing cost. Preferably, peripheral portions of the color filters 131, 132 and 133 are overlapped with a peripheral portion of the data line 120. Referring to FIG. 22, a buffer layer 140 is then formed on the insulating substrate 100.

A first conductive material such as Al or Al alloy, and a second conductive material such as Mo or Mo alloy are then deposited successively by means of a process such as sputtering, and the deposited conductive material is then patterned. Therefore, gate wirings 150, 151 and 152 are formed on the buffer layer 140 by means of a photolithography process using a mask. The gate wirings 150, 151 and 152 include a gate line 150, a gate electrode 151 and a gate pad 152. The gate wirings 150, 151 and 152 may have a mono layered structure.

Figure 24:
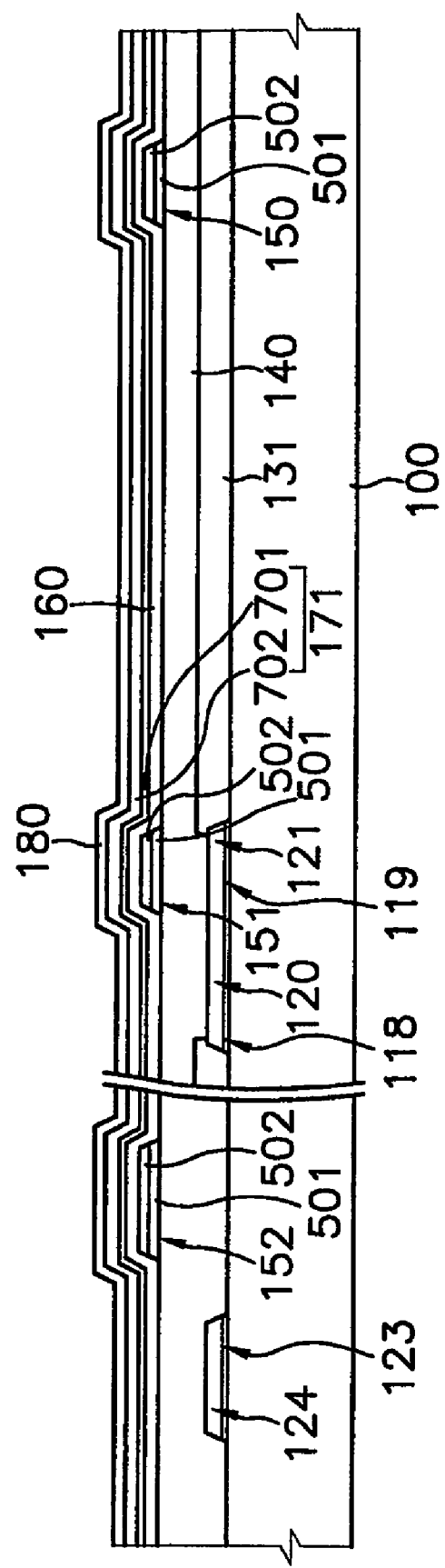

Referring to FIG. 24, a gate insulating layer 160 deposited at a low temperature, a first amorphous silicon layer 701, a second amorphous silicon layer 702 and a doped amorphous silicon layer 180 are then deposited successively on the gate wirings 150, 151 and 152 and the buffer layer 140.

The gate insulating layer 160 has an organic insulating layer, an amorphous silicon oxide layer deposited at a low temperature and an amorphous silicon nitride layer deposited at a low temperature. The gate insulating layer 160 may be deposited at a low temperature such as a temperature no more than about 250° C.

The first amorphous silicon layer 701 includes an amorphous silicon having a band gap energy of from about 1.9 eV to about 2.1 eV, and the second amorphous silicon layer 702 includes an amorphous silicon having a band gap energy of from about 1.7 eV to about 1.8 eV. The first amorphous silicon layer 701 is deposited by means of a chemical vapor deposition (CVD) using a $SiH_4$ gas that has $CH_4$ gas, $C_2H_2$ gas or $C_2H_6$ gas of predetermined amount. The $SiH_4$ is used to form an amorphous silicon. For example, the $SiH_4$ gas and $CH_4$ gas are applied to the CVD in a ratio of 1 to 9, thereby depositing an amorphous silicon layer including carbon at a concentration of about 50 at % and a band gap energy of from about 2.0 eV to about 2.3 eV. The band gap energy of an amorphous silicon layer is dependent on a condition of deposition process, and the band gap energy may be between about 1.7 eV and about 2.5 eV corresponding to an amount of a carbon compound.

The gate insulating layer 160 deposited at a low temperature, the first amorphous silicon layer 701, the second amorphous silicon layer 702 and the doped amorphous silicon layer 180 may be deposited successively in situ by means of the CVD.

Figure 25:
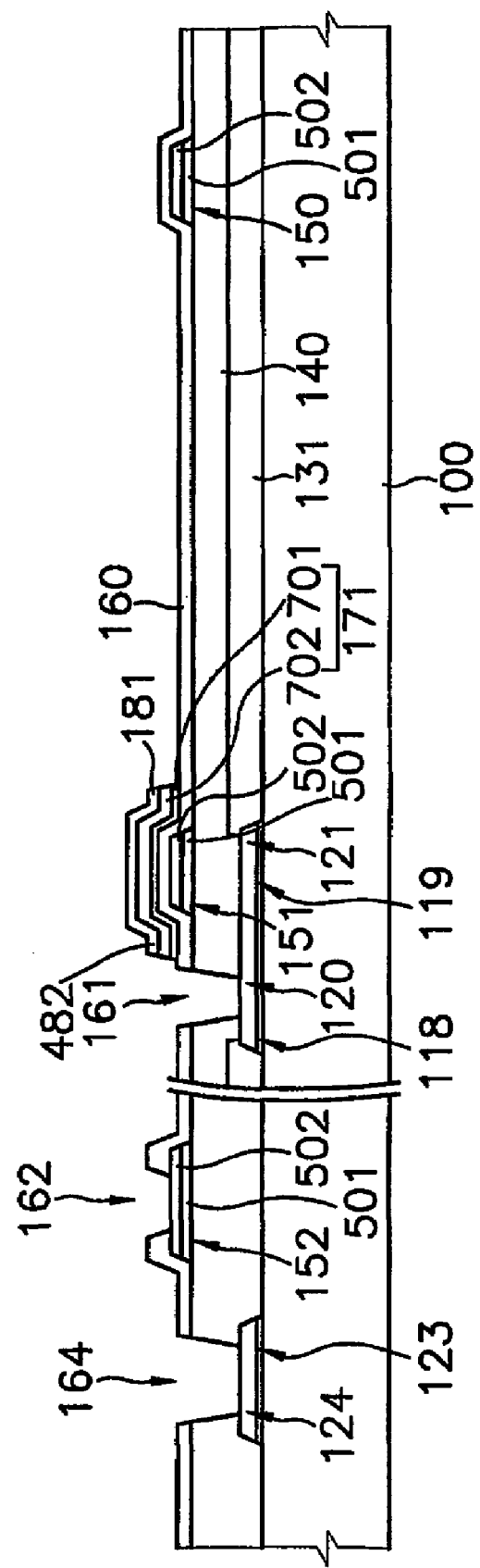

Referring to FIG. 25, the first amorphous silicon layer 701, the second amorphous silicon layer 702 and the doped amorphous silicon layer 180 are patterned. Therefore, a semiconductor layer 171 of an island shape, an ohmic contact layer 181 and contact holes 161, 162 and 164 are formed by means of a photolithography process using a mask. The contact holes 161, 162 and 164 are disposed on the gate insulating layer 160 deposited at a low temperature and the organic insulating layer 140. The data line 120, the gate pad 152 and the data pad 124 are exposed through the contact holes 161, 162 and 164, respectively.

A first amorphous silicon layer 701, a second amorphous silicon layer 702 and a doped amorphous silicon layer 180 are then removed except a portion of the layers 701, 702 and 180 disposed on the gate electrode 151. A portion of the layers 701, 702 and 180 on the gate pad 152 and a portion of the gate insulating layer 160 on the gate pad 152 are removed. A portion of the layers 701, 702, 180 and 160 on the data line 120 and the data pad 124 are removed. A portion of the organic insulating layer 140 on the data line 120 and the data pad 124 are also removed.

In order to perform a photolithography process using only one mask, a photoresist film pattern having portions of different thickness is used as an etching mask.

Figure 26:
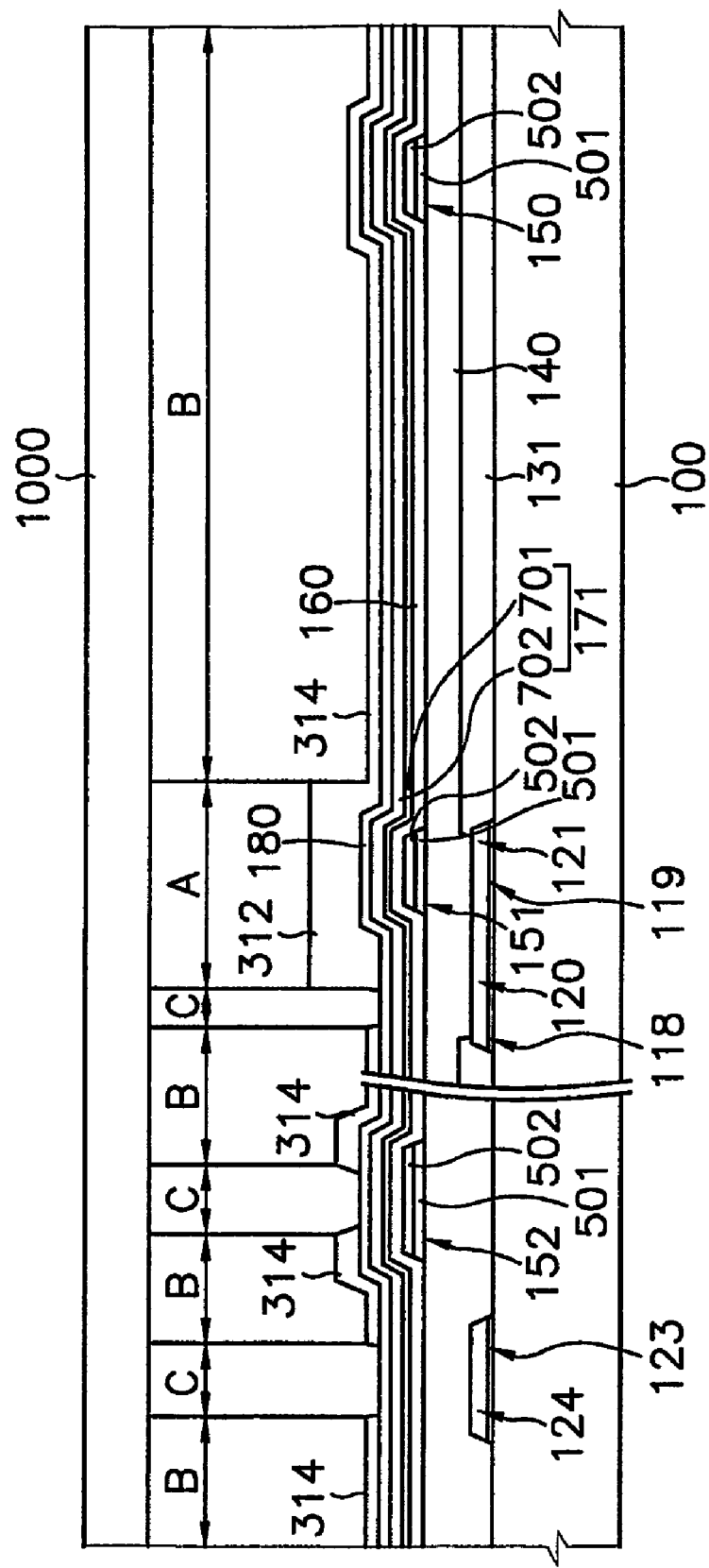

Referring to FIG. 26, a photoresist film is coated on an upper portion of the doped amorphous silicon layer 180. The thickness of the photoresist film is between about 1 μm and about 2 μm. Photoresist film patterns 312 and 314 are then formed by means of a photo process. The photo process has an exposure process using a mask and a developing process.

A first region 312 is thicker than a second region 314. A portion of the photoresist film disposed on the data line 120, the data pad 124 and the gate pad 152 are removed. The first region 312 is disposed on the gate electrode 151. Preferably, the ratio of the first region 312 to the second region 314 is not more than or equal to about a half. The remaining thickness of the photoresist film of the first region 312 may be no more than about 4,000 Å.

Various methods may be used to form a photoresist film pattern having portions of different thickness. Hereinafter, a positive photoresist film is used.

When the photoresist film is exposed through the mask, polymers at a portion of the photoresist film directly exposed by the light are fully decomposed, polymers at a portion of the photoresist film, on which the translucent film is disposed, are partially decomposed, and polymers at a masked portion of the photoresist film are not decomposed.

When the photoresist film is developed, a portion in which high polymers are not decomposed remains. Therefore, a thickness of photoresist film in partially exposed portion is thinner than a thickness of photoresist film in unexposed portion. When exposing time is too long, all the high polymers are decomposed. Therefore, controlling the exposing time is required so that all the high polymers are not decomposed.

When the photoresist film is developed, polymers in the first region 312 remain, polymers in the second region 314 are partially removed so that a thickness of the second region 314 is thinner than a thickness of the first region 312, and polymers in the region 'C' are fully removed. The second region 314 is partially exposed by the light. Therefore, a photoresist film pattern having portions of different thickness is formed.

Figure 27:
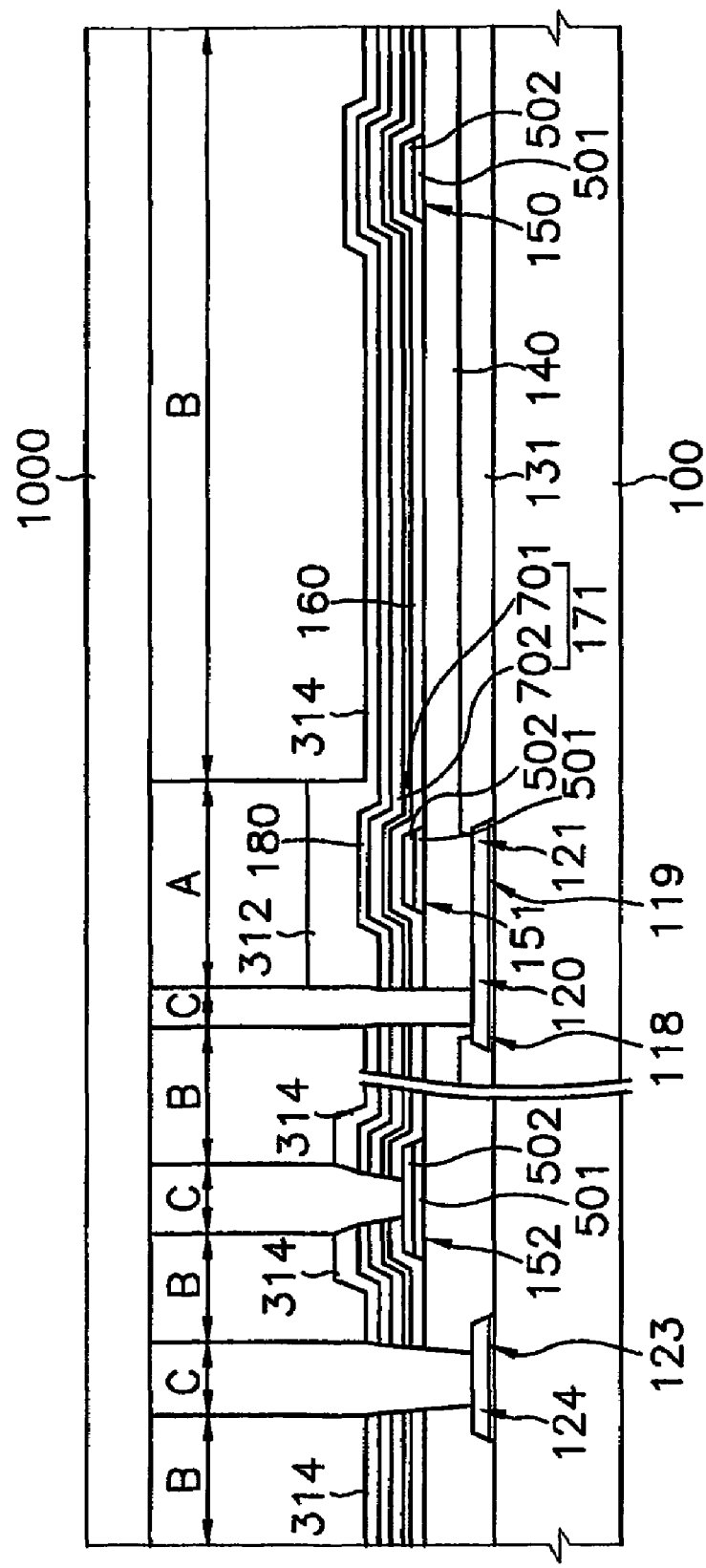

Referring to FIG. 27, the doped amorphous silicon layer 180, the second amorphous silicon layer 702, the first amorphous silicon layer 701 and the gate insulating layer 160 deposited at a low temperature are then dry etched to form a contact hole 162 exposing the gate pad 152 and to expose the buffer layer 140 of the region 'C'. The buffer layer 140 of the region 'C' is dry etched to form contact holes 161 and 164, through which the data line 120 and the data pad 124 are exposed. The dry etching is performed by means of the photoresist film patterns 312 and 314 as an etching mask.

The second region 314 of the photoresist film is then fully removed by means of an ashing process using oxygen.

Therefore, the second region 314 of the photoresist film pattern is removed, the doped amorphous silicon layer 180 is exposed, and a thickness of the first region 312 of the photoresist pattern decreases to be substantially identical to a thickness of the second region 314 of the photoresist pattern.

The doped amorphous silicon layer 180, the first amorphous silicon layer 701 and the second amorphous silicon layer 702 are then etched by means of the first region 312 of a remaining photoresist pattern as an etching mask. Therefore, the doped amorphous silicon layer 180, the first amorphous silicon layer 701 and the second amorphous silicon layer 702 are removed, and the semiconductor layer 171 and the ohmic contact layer 181 remain. The semiconductor layer 171 having an island shape is formed on the gate insulating layer 160 under which the gate electrode is formed. The gate insulating layer 160 is disposed on the gate electrode 151.

The first region 312 of the remaining photoresist pattern is then removed. An ashing process using oxygen may be used to remove the first region 312 of the remaining photoresist pattern.

Figure 28:
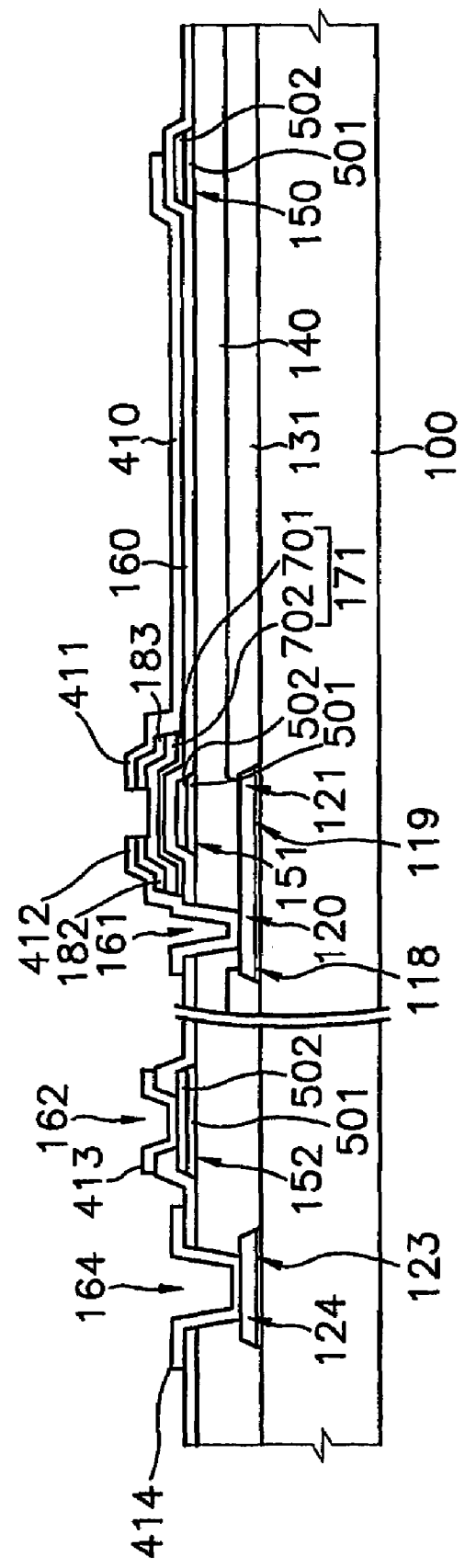

Referring to FIG. 28, an ITO layer is then deposited and patterned. Therefore, a pixel electrode 410, a source electrode 412, a drain electrode 411, an auxiliary gate pad 413 and an auxiliary data pad 414 are formed by means of a photolithography process using a mask.

The ohmic contact layer 181 is etched by means of the source electrode 412 and the drain electrode 411 as an etching mask, thereby forming an ohmic contact layer pattern and exposing the semiconductor layer 171. The ohmic contact layer 181 is disposed between the source electrode 412 and the drain electrode 411. The ohmic contact layer patterns 182 and 183 have a first region 182 and a second region 183 that is separated from the first region 182. The semiconductor layer 171 is disposed between the source electrode 412 and the drain electrode 411.

Referring to FIGS. 19 to 20, a first insulating layer such as silicon nitride or oxygen nitride and a second insulating layer such as a photoresist organic material including a black colorant are deposited on the lower insulating substrate 100 successively, and a color organic layer 430 is formed by means of a photo process using a mask. The photo process has an exposure process and a developing process. The first insulating material and the second insulating material are etched by means of the color organic layer 430 as an etching mask to form a passivation layer 190. The color organic layer 430 may mask a light incident into a TFT. The black matrix 121 masks the leaked light, and the black matrix 121 may be separated from the data line 120 to form a disconnected wiring. The black matrix 121 has a function substantially identical to a black matrix that masks the leaked light. The black matrix 121 may also be formed on the gate wirings or the data wirings to mask a light that is leaked adjacent to the gate wirings and the data wirings. The black matrix 121 may also be used as a spacer by means of a height control of the organic layer 430.

A transparent conductive material such as ITO or IZO is stacked on the upper insulating substrate 200 to form a common electrode 210.

A copper alloy wiring is used as gate wirings or data wirings according to the exemplary embodiments of the present invention. However, the copper alloy wiring may also be used as any metal layer formed on a substrate. The copper alloy wiring may also be used as source/drain electrode.

INDUSTRIAL APPLICABILITY

As described previously, a TFT substrate for an LCD apparatus is manufactured by means of a copper alloy wiring to have low resistance and high conductance.

Also, a copper wiring is formed by means of a thin diffusion barrier layer and the copper alloy including the material of the diffusion barrier layer so that simultaneous etching is possible. A mutual diffusion between the copper wiring and the substrate in subsequent processes is also prevented by means of the thin diffusion barrier layer.

This invention has been described above with reference to the aforementioned embodiments. It is evident, however, that many alternative modifications and variations will be apparent to those having skills in the art in light of the foregoing description. Accordingly, the present invention embraces all such alternative modifications and variations as fall within the spirit and scope of the appended claims.

The invention claimed is:

1. A TFT substrate for an LCD apparatus comprising:
a silicon-containing substrate;
a diffusion barrier layer formed directly on the substrate; and
a copper alloy layer formed on the diffusion barrier layer, the copper alloy layer including a material from about 0.5 at % to about 15 at %, which is used to form the diffusion barrier layer.

2. The TFT substrate of claim 1, wherein the diffusion barrier layer comprises a silicide compound including at least one selected from the group consisting of Zr, Ti, Hf, V, Ta, Ni, Cr. Nb, Co, Mn, Mo, W, Rh, Pd and Pt.

3. The TFT substrate of claim 1, wherein a thickness of the diffusion barrier layer is from about 50 Å to about 5,000 Å.

4. The TFT substrate of claim 1, wherein the copper alloy layer is a metal layer corresponding to a gate line, a source-drain electrode or a data line.

5. The TFT substrate of claim 1, wherein the silicon-containing substrate is a silicon substrate, a glass substrate or a plastic substrate.

* * * * *